(12) United States Patent
Matsuzawa

(10) Patent No.: US 7,491,973 B2
(45) Date of Patent: Feb. 17, 2009

(54) SEMICONDUCTOR LSI CIRCUIT HAVING A NAND LOGIC GATE WITH A HIGHLY INTEGRATED AND MICROSCOPIC STRUCTURE

(75) Inventor: Kazuya Matsuzawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 165 days.

(21) Appl. No.: 11/165,194

(22) Filed: Jun. 24, 2005

(65) Prior Publication Data

US 2006/0197111 A1   Sep. 7, 2006

(30) Foreign Application Priority Data

Mar. 2, 2005    (JP)    ............. P2005-057388

(51) Int. Cl.
  *H01L 29/10*  (2006.01)
  *H01L 29/73*  (2006.01)
  *H01L 29/76*  (2006.01)

(52) U.S. Cl. ............... 257/67; 257/206; 257/365; 257/369

(58) Field of Classification Search ............ 257/67, 257/69, 206, 269, 270, 365, 369, E21.455, 257/E27.064, E29.126, E29.137
See application file for complete search history.

(56) References Cited

U.S. PATENT DOCUMENTS 5,461,250 A * 10/1995 Burghartz et al. ........... 257/347

5,801,397 A *  9/1998 Cunningham ............... 257/66
6,504,173 B2 *  1/2003 Hsu et al. .................... 257/60

FOREIGN PATENT DOCUMENTS

| JP | 2001-051292 | 2/2001 |
| JP | 2002-289697 | 10/2002 |

OTHER PUBLICATIONS

Notification of the First Office Action issued by the Chinese Patent Office on Jun. 13, 2008, for Chinese Patent Application No. 200610059431.0, and English-language translation thereof.

* cited by examiner

*Primary Examiner*—Hung Vu
(74) *Attorney, Agent, or Firm*—Finnegan, Henderson, Farabow, Garrett & Dunner, L.L.P.

(57) ABSTRACT

Basic logic gates are formed in a small area, and a highly integrated and microscopic structure is provided. In an nMOSFET and a pMOSFET, gate electrodes are formed facing each other and sandwiching a semiconductor region via gate insulting layers. Respective drain regions of the nMOSFET and the pMOSFET are connected to each other. A high potential is applied to a source region of the pMOSFET while an intermediate potential between the high and a low potential is applied to a source region of the nMOSFET. As a result, a NAND gate is provided. The intermediate potential between the high and the low potential is applied to the source region of the pMOSFET. The low potential is applied to the source region of the nMOSFET. As a result, a NOR gate is provided.

12 Claims, 23 Drawing Sheets

FIG. 3A

| A | B | OUT |
|---|---|-----|
| L | L | H   |
| L | H | H   |
| H | L | H   |
| H | H | L   |

FIG. 3B

| A | B | OUT |
|---|---|-----|
| L | L | H   |
| L | H | L   |
| H | L | L   |
| H | H | L   |

US 7,491,973 B2

SEMICONDUCTOR LSI CIRCUIT HAVING A NAND LOGIC GATE WITH A HIGHLY INTEGRATED AND MICROSCOPIC STRUCTURE

CROSS REFERENCE TO RELATED APPLICATIONS AND INCORPORATION BY REFERENCE

This application is based upon and claims the benefit of priority from prior Japanese Patent Applications P2005-57388 filed on Mar. 2, 2005; the entire contents of which are incorporated by reference herein.

BACKGROUND OF THE INVENTION

1. Field of the Invention

The present invention relates to a semiconductor LSI (Large-Scale Integration) circuit and a method for fabricating the semiconductor LSI circuit. More specifically, it relates to a semiconductor LSI circuit having basic logic gates with a highly integrated and microscopic structure, such as a NAND gate and a NOR gate.

2. Description of the Related Art

A conventional basic device having an LSI logic region made up of basic logic gate circuits such as a NAND gate and a NOR gate has a basic structure using a complementary metal-oxide semiconductor (CMOS), as shown in FIG. 1. As shown in FIG. 1, a conventional CMOS structure is fabricated by forming a well region 74 on a semiconductor substrate 72, a device isolating region 54, such as shallow trench isolation (STI). Then, an nMOSFET having $n^+$ diffusion regions 64 and 66 as source and drain regions, respectively, and a pMOSFET having $p^+$ diffusion regions 70 and 68 as source and drain regions, respectively connected to a common input terminal 50 and gate electrodes 56 and 60 formed on the semiconductor substrate 72 via respective gate insulating layers 58 and 62. The drain regions 66 and 68 are connected to a common output terminal 52. The CMOS structure shown in FIG. 1 can form a CMOS inverter by connecting the $n^+$ diffusion region 64 of the nMOSFET to ground potential $V_{SS}$ (not shown in the drawing) and the $p^+$ diffusion region 70 of the pMOSFET to power supply voltage $V_{DD}$ (not shown in the drawing). On the other hand, fabrication of a NAND gate or a NOR gate requires two CMOS structures or four MOSFETs.

A compact CMOS structure may be provided by forming a common metallic region as drain regions of a pMOSFET and an nMOSFET (e.g., Japanese Patent Application Laid-Open No. 2002-289697). This structure provides only a NOT gate.

A structure of a semiconductor device including a threshold-controllable thin-film transistor (TFT) with multiple layers of a back gate electrode, a first gate insulating layer, an active semiconductor layer, a second gate insulating layer, and a gate electrode formed on an insulating substrate has been disclosed (e.g., Japanese Patent Application Laid-Open No. 2001-51292). The above disclosure shows the back gate electrode only used for correcting a threshold voltage, but does not disclose a basic logic gate, which utilizes a double-gate structure.

SUMMARY OF THE INVENTION

One aspect of the present invention inheres in a semiconductor LSI circuit. The circuit includes a first semiconductor region; a first gate insulating layer on one side of the first semiconductor region; a first gate electrode on the first gate insulating layer; a first source region and a common drain region arranged to sandwich the first semiconductor region; a second gate insulating layer on the other side of the first semiconductor region; a second gate electrode on the second gate insulating layer; a second semiconductor region adjacent to the common drain region; a third gate insulating layer on one side of the second semiconductor region; a third gate electrode on the third gate insulating layer; a second source region adjacent to the second semiconductor region and facing the common drain region; a fourth gate insulating layer on the other side of the second semiconductor region; and a fourth gate electrode on the fourth gate insulating layer. The first semiconductor region, the first gate insulating layer, the first gate electrode, the first source region, and the common drain region constitute a first transistor. The first semiconductor region, the second gate insulating layer, the second gate electrode, the first source region, and the common drain region constitute a second transistor. The second semiconductor region, the third gate insulating layer, the third gate electrode, the second source region, and the common drain region constitute a third transistor; and the second semiconductor region, the fourth gate insulating layer, the fourth gate electrode, the second source region, and the common drain region constitute a fourth transistor.

Another aspect of the present invention inheres in a semiconductor LSI circuit. The circuit includes a first semiconductor region; a first gate insulating layer on one side of the first semiconductor region; a first floating gate electrode on the first gate insulating layer; a first control gate electrode on the first floating gate electrode and provided by a first inter-gate insulating layer; a first source region and a common drain region sandwiching the first semiconductor region; a second gate insulating layer on the other side of the first semiconductor region; a second floating gate electrode on the second gate insulating layer; a second control gate electrode on the second floating gate electrode and provided by the first inter-gate insulating layer; a second semiconductor region adjacent to the common drain region; a third gate insulating layer on one side of the second semiconductor region; a third floating gate electrode on the third gate insulating layer; a third control gate electrode on the third floating gate electrode and provided by a second inter-gate insulating layer; a second source region adjacent to the second semiconductor region facing the common drain region; a fourth gate insulating layer on the other side of the second semiconductor region; a fourth floating gate electrode on the fourth gate insulating layer; and a fourth control gate on the fourth floating gate electrode and provided by the second inter-gate insulating layer. The first semiconductor region, the first gate insulating layer, the first gate electrode, the first source region, and the common drain region constitute a first transistor. The first semiconductor region, the second gate insulating layer, the second gate electrode, the first source region, and the common drain region constitute a second transistor; the second semiconductor region, the third gate insulating layer, the third gate electrode, the second source region, and the common drain region constitute a third transistor. The second semiconductor region, the fourth gate insulating layer, the fourth gate electrode, the second source region, and the common drain region constitute a fourth transistor.

Another aspect of the present invention inheres in a method for fabricating a semiconductor LSI circuit. The method includes depositing a semiconductor layer on an insulating substrate and forming a tabular semiconductor layer by reactive ion etching; forming a gate insulating layer on a surface of the semiconductor layer by one of thermal oxidation and deposition; depositing a gate electrode material so as to form nMOSFET gate electrodes and pMOSFET gate electrodes;

patterning a resist and forming an n⁺ source region by doping donor impurities by ion implantation, solid phase diffusion, or vapor phase diffusion; patterning a resist and forming a p⁺ source region by doping acceptor impurities by ion implantation, solid phase diffusion, or vapor phase diffusion; and removing an exposed gate insulating layer, depositing and heating a metallic material such as titanium (Ti) or cobalt (Co) so as to activate the n⁺ source region and the p⁺ source region, and at the same time, forming metal silicide on the exposed surface of the semiconductor layer and removing a metallic material that has not reacted with the silicide.

The present invention provides a semiconductor LSI circuit, where basic NAND/NOR gates are formed within a small area. As a result, a highly integrated and microscopic structure is provided.

BRIEF DESCRIPTION OF DRAWINGS

FIG. 3A is the truth table for the NAND gate of FIG. 2A;

FIG. 3B is the truth table for the NOR gate of FIG. 2B;

DETAILED DESCRIPTION OF THE INVENTION

Figure 1:
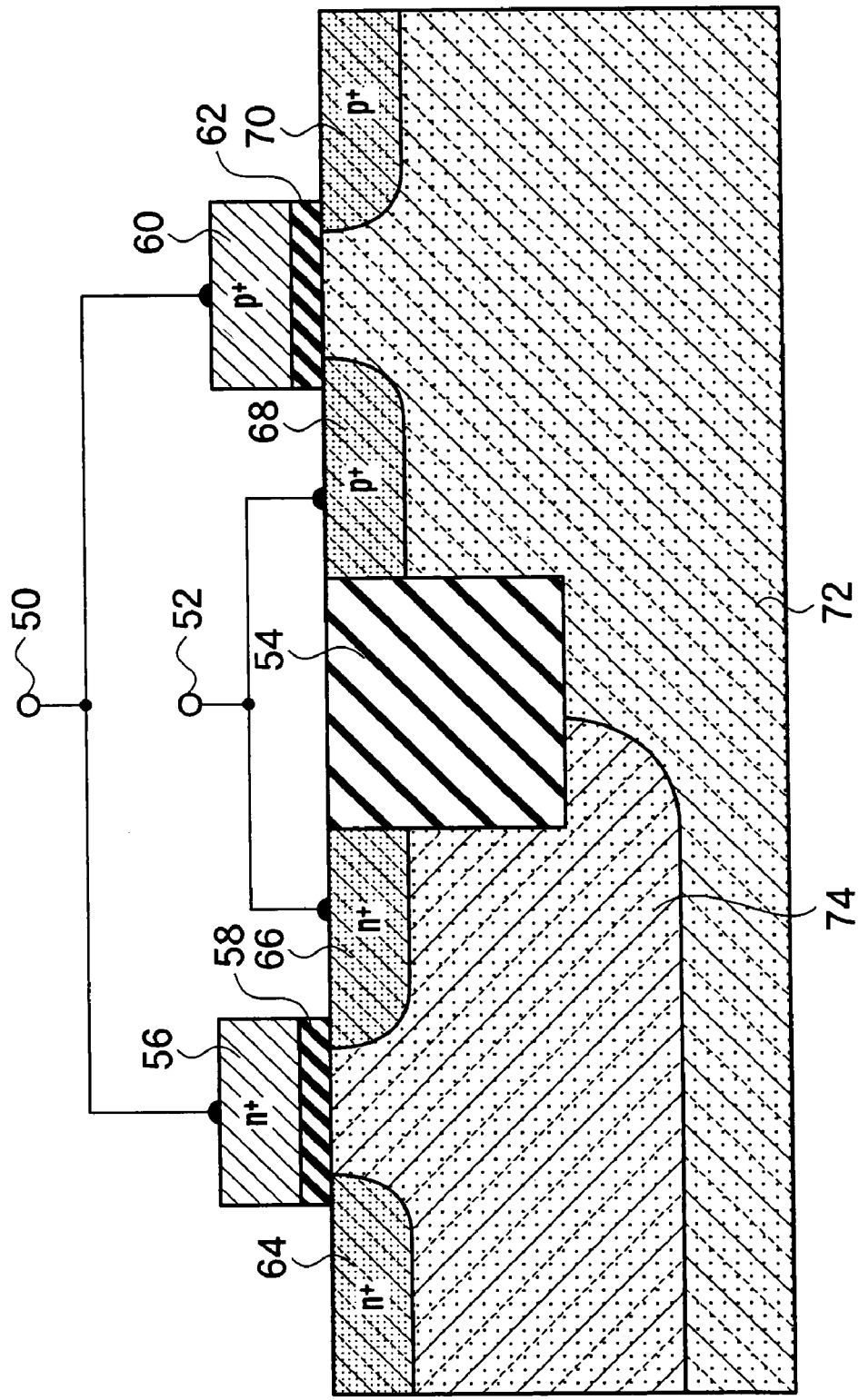
FIG. 1 shows a schematic cross-sectional structure of a conventional basic CMOS.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally, and as is conventional in the representation of the device structure, it will be appreciated that the various drawings are not drawn to scale from one figure to another nor inside a given figure, and in particular that the device cross-sectional diagrams are arbitrarily drawn for facilitating the reading of the drawings.

In the following descriptions, numerous specific details are set forth to provide a thorough understanding of the present invention. However, it will be obvious to those skilled in the art that the present invention may be practiced without such specific details. In other instances, well-known device structures have been shown in cross-sectional form in order not to obscure the present invention with unnecessary detail.

Referring to the drawings, embodiments of the present invention are described below. The same or similar reference numerals are attached to identical or similar parts among the following drawings. The embodiments shown below exemplify a device structure and a fabrication method that are used to implement the technical ideas according to the present invention, and do not limit the technical ideas according to the present invention to those that appear below. These technical ideas, according to the present invention, may receive a variety of modifications that fall within the claims.

Next, the embodiments of the present invention are described while referencing the drawings. The same or similar symbols are given to the same or similar parts throughout the appended drawings. However, it should be noted that the drawings are merely schematics so that the planar dimensions of respective cross-sectional structures, the planar dimensions of respective circuit structures, and the scales or the like for respective current voltage characteristics differ from those of the actual invention. Furthermore, parts with differing dimensions and/or differing ratios among the drawings may be included. In addition, the embodiments given forthwith exemplify devices and methods for embodying the technical ideas of the present invention, and those technical ideas are not limited to the following arrangements or the like. The technical ideas of the present invention may be modified into various modifications within the scope of the appended claims.

It should be noted that respective expressions of 'one side surface' and 'the other side surface' are used for convenience in the description of the semiconductor LSI circuit, according to the embodiments of the present invention. Alternatively, 'side surface' may be used. Furthermore, reference numerals for upper surfaces 10u and 12u and under surfaces 10d and 12d are also used for convenience. In particular, with a FIN structure, side surfaces should be defined rather than under surfaces. Therefore, the expression 'one side surface' or 'the other side surface' is used here.

(Basic Logic Gate)

Figure 2A:
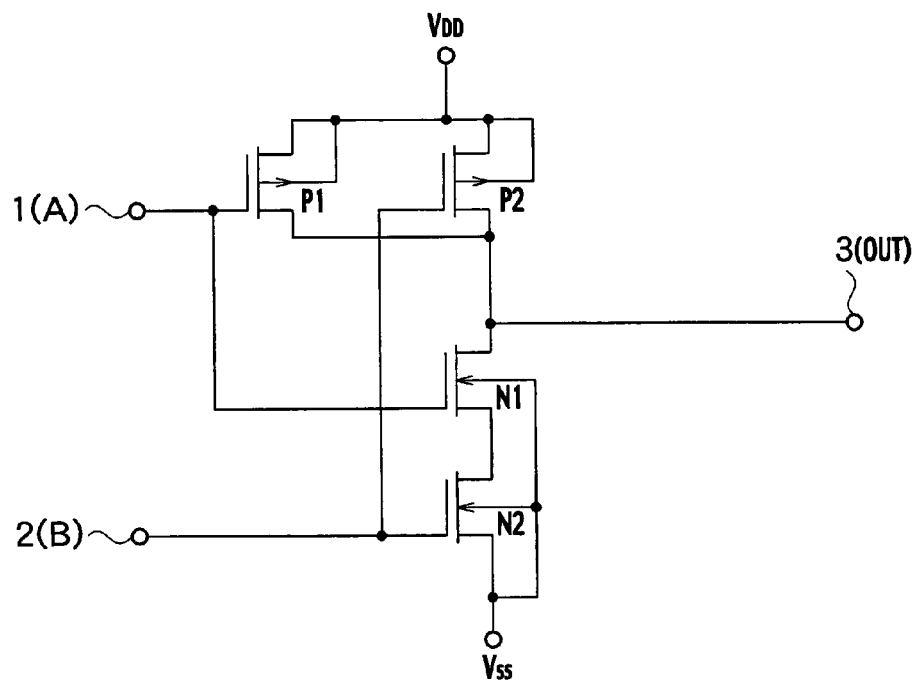
FIG. 2A shows a basic circuit structure of a NAND gate constituted by a semiconductor LSI circuit, according to embodiments of the present invention.

Basic logic gates such as NAND gates and NOR gates constituting an LSI logic region are structured using MOSFETs as shown in FIG. 2. As shown in FIG. 2A, a NAND gate has the source terminals of two pMOSFETs P1 and P2 connected in parallel to a high potential $V_{DD}$ and the drain terminals thereof connected in parallel to an output terminal 3. In addition, two nMOSFETs are connected in series, the source terminal of an nMOSFET N2 is connected to a low potential $V_{SS}$, and the drain terminal of another nMOSFET N1 is connected to the output terminal 3. As shown in FIG. 2A, the NAND gate is made up of p-channel transistors P1 and P2, which are connected in parallel between the $V_{DD}$ terminal and the output terminal 3, n-channel transistors N1 and N2, which are connected in series between the $V_{SS}$ terminal and the output terminal 3, an input terminal 1, which is connected to both the gate electrodes of the p-channel transistor P1 and the n-channel transistor N1, and an input terminal 2, which is connected to both the gate electrodes of the p-channel transistor P2 and the n-channel transistor N2. The truth table for the NAND gate of FIG. 2A is as shown in FIG. 3A.

Figure 2B:
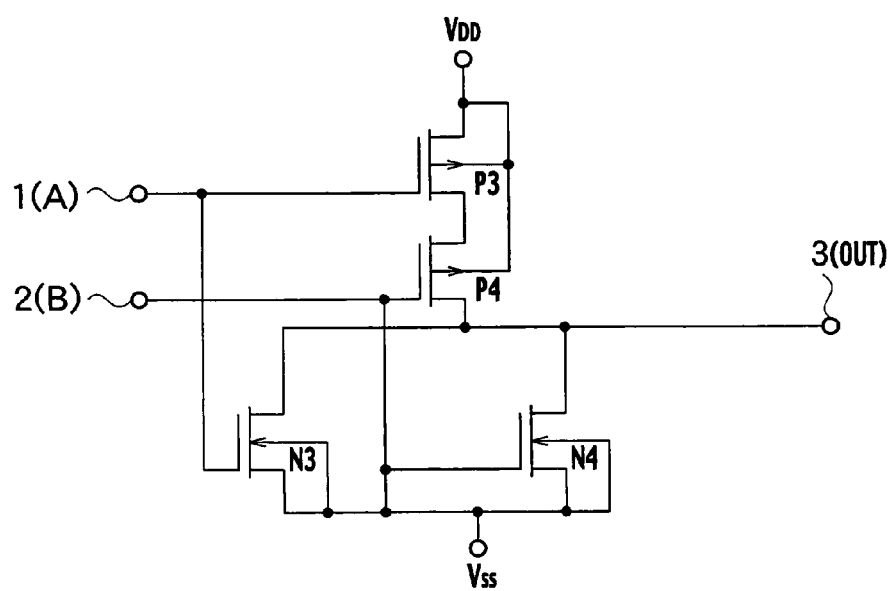
FIG. 2B shows a basic circuit structure of a NOR gate constituted by the semiconductor LSI circuit, according to the embodiments of the present invention.

As shown in FIG. 2B, a NOR gate has two pMOSFETs P3 and P4 connected in series and the source terminal of the pMOSFET P3 connected to a high potential $V_{DD}$ and the drain terminal of the pMOSFET P4 connected to the output terminal 3. In addition, the source terminals of two nMOSFETs N3 and N4 are connected in parallel to a low potential $V_{SS}$, and the drain terminals thereof are connected in parallel to the output terminal 3. As shown in FIG. 2B, the NOR gate is made up of p-channel transistors P3 and P4, which are connected in series between the $V_{DD}$ terminal and the output terminal 3, n-channel transistors N3 and N4, which are connected in parallel between the $V_{SS}$ terminal and the output terminal 3, an input terminal 1, which is connected to both the gate electrodes of the p-channel transistor P3 and the n-channel transistor N3, and an input terminal 2, which is connected to both the gate electrodes of the p-channel transistor P4 and the n-channel transistor N4. The truth table for the NOR gate of FIG. 2B is as shown in FIG. 3B.

FIRST EMBODIMENT

Figure 4:
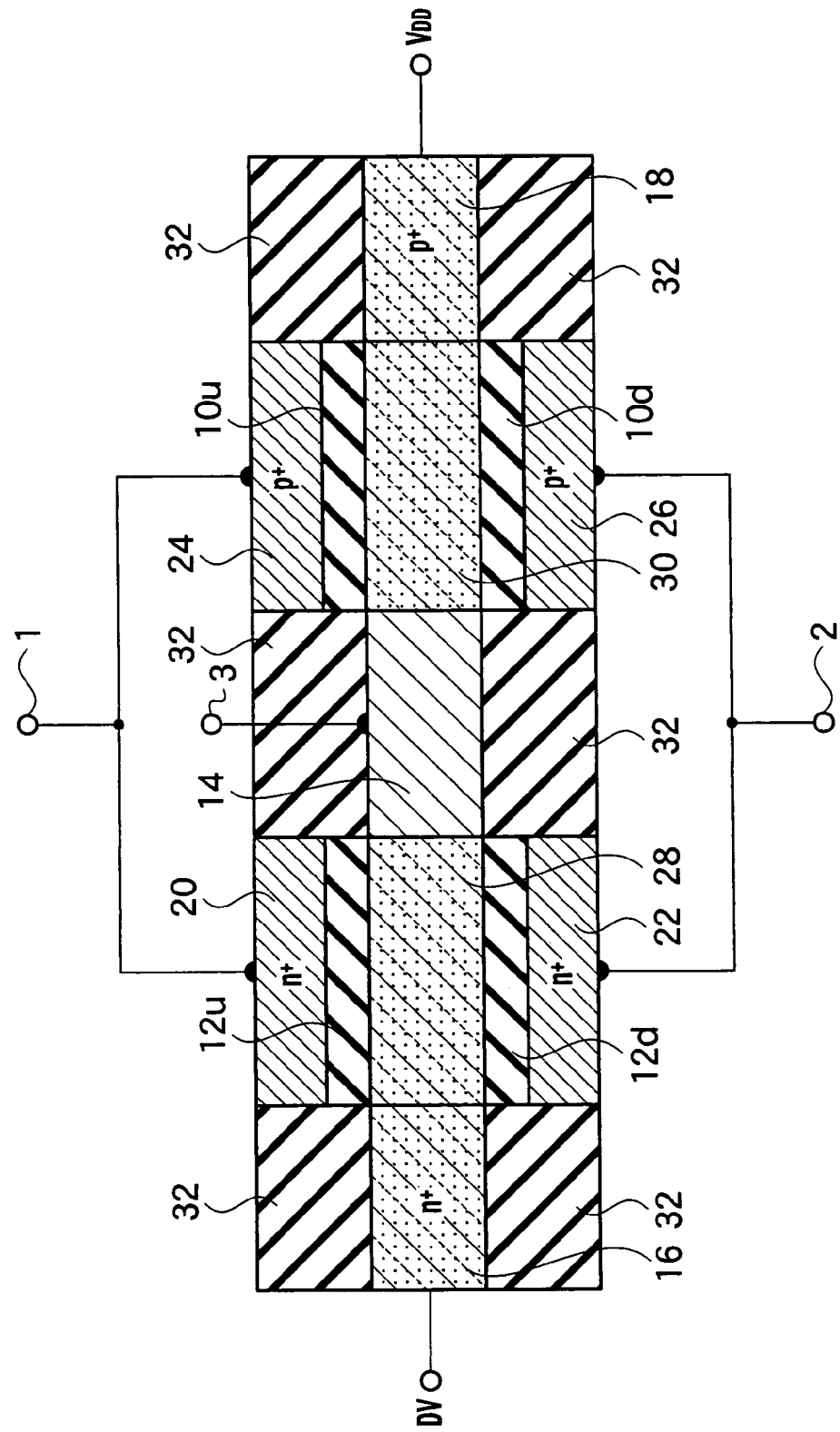
FIG. 4 shows a schematic cross-sectional structure of a semiconductor LSI circuit, according to a first embodiment of the present invention.

FIG. 4 shows a schematic cross-sectional structure of a first embodiment of a semiconductor LSI circuit. The structure includes a first semiconductor region 28, a first gate insulating layer 12u on one side of the first semiconductor region 28, a first gate electrode 20 on the first gate insulating layer 12u, a first source region 16 and a common drain region 14 arranged to sandwich the first semiconductor region 28, a second gate insulating layer 12d under the other side of the first semiconductor region 28, a second gate electrode 22 under the second gate insulating layer 12d, a second semiconductor region 30 adjacent to the common drain region 14, a third gate insulating layer 10u on one side of the second semiconductor region 30, a third gate electrode 24 on the third gate insulating layer 10u, a second source region 18 adjacent to the second semiconductor region 30 and formed to face the common drain region 14, a fourth gate insulating layer 10d under the other side of the second semiconductor region 30, and a fourth gate electrode 26 under the fourth gate insulating layer 10d. The first semiconductor region 28, the first gate insulting layer 12u, the first gate electrode 20, the first source region 16, and the common drain region 14 constitute a first transistor N1. The first semiconductor region 28, the second gate insulting layer 12d, the second gate electrode 22, the first source region 16, and the common drain region 14 constitute a second transistor N2. The second semiconductor region 30, the third gate insulting layer 10u, the third gate electrode 24, the second source region 18, and the common drain region 14 constitute a third transistor P1. The second semiconductor region 30, the fourth gate insulating layer 10d, the fourth gate electrode 26, the second source region 18, and the common drain region 14 constitute a fourth transistor P2.

When a certain voltage is applied to the first gate electrode 20, a first conductive channel is generated for the first transistor N1 in the first semiconductor region 28. When a certain voltage is applied to the second gate electrode 22, a first conductive channel is generated for the second transistor N2 in the first semiconductor region 28. When a certain voltage is applied to the third gate electrode 24, a second conductive channel is generated for the third transistor P1 in the second semiconductor region 30. When a certain voltage is applied to the fourth gate electrode 26, a second conductive channel is generated for the fourth transistor P2 in the second semiconductor region 30.

Three different potentials: a high potential $V_{DD}$, an intermediate potential (e.g., 0 V) lower than the high potential $V_{DD}$, and a low potential $V_{SS}$ lower than the intermediate potential are provided. The high potential $V_{DD}$ is applied to the second source region 18 while the intermediate potential is applied to the first source region 16. The first through the fourth transistor N1, N2, P1, and P2 constitutes a NAND gate.

A schematic cross-sectional structure of the semiconductor LSI circuit, according to the first embodiment of the present invention, is shown in FIG. 4. In the nMOSFETs N1 and N2 and the pMOSFETs P1 and P2, the gate electrodes 20 and 22 are formed to face each other and sandwich the semiconductor region 28 via the gate insulting layers 12. The gate electrodes 24 and 26 are formed to face each other and sandwich the semiconductor region 30 via the gate insulting layers 10, respectively. The common drain region 14 is made of a metallic material or a metallic compound and is shared by the nMOSFET and the pMOSFET. The high potential $V_{DD}$ is applied to the source region 18 of the pMOSFET while the intermediate potential (e.g., 0 V), lower than the high potential $V_{DD}$, is applied to the source region 16 of the nMOSFET, constituting a NAND gate.

Figure 5:
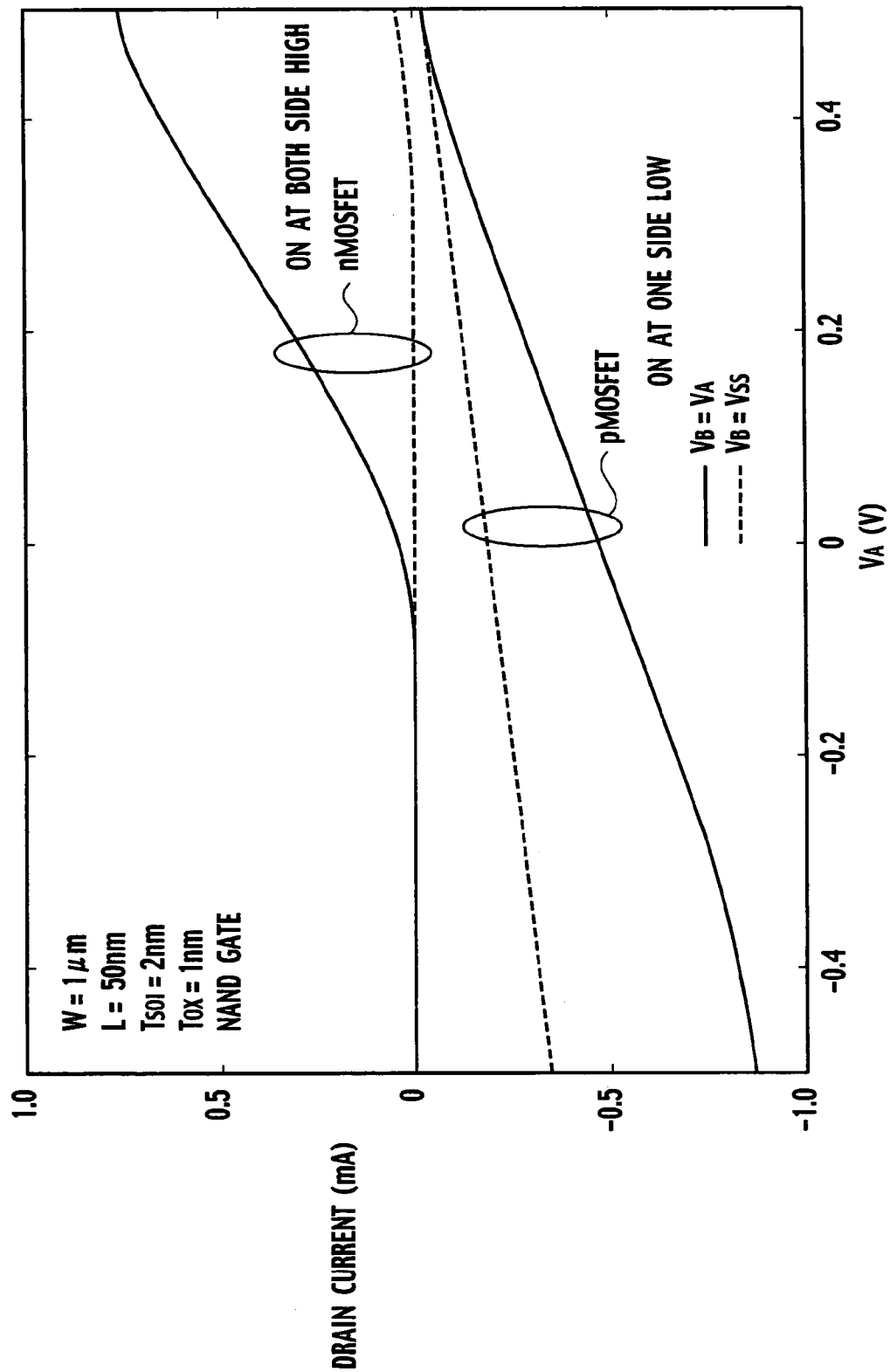
FIG. 5 is graph showing current-voltage characteristics of an nMOSFET and a pMOSFET in FIG. 4.

FIG. 5 is a graph showing current-voltage characteristics of an nMOSFET and a pMOSFET in the semiconductor LSI circuit, according to the first embodiment of the present invention. A case of changing voltage $V_A$ at an A input terminal 1 and voltage $V_B$ at a B input terminal 2 at the same time ($V_B=V_A$) and a case of changing only $V_A$ with $V_B$ fixed to a low level $V_{SS}$ in a logic amplitude ($V_B=V_{SS}$) are shown. Since the pMOSFET is turned on in both cases, the same results are achieved as with the case of connecting pMOSFETs in parallel. On the other hand, since the nMOSFET is turned on only when $V_B=V_A$, the same results are achieved as with the case of connecting nMOSFETs in series.

The common drain region 14 or a shared metallic region may be made of titanium silicide ($TiSi_2$), cobalt silicide ($CoSi_2$), nickel silicide (NiSi), platinum silicide (PtSi) erbium silicide ($ErSi_2$) or the like.

According to the semiconductor LSI circuit of the first embodiment of the present invention, NAND gates are formed within a small area, and a highly integrated and microscopic structure can be provided.

SECOND EMBODIMENT

Figure 6:
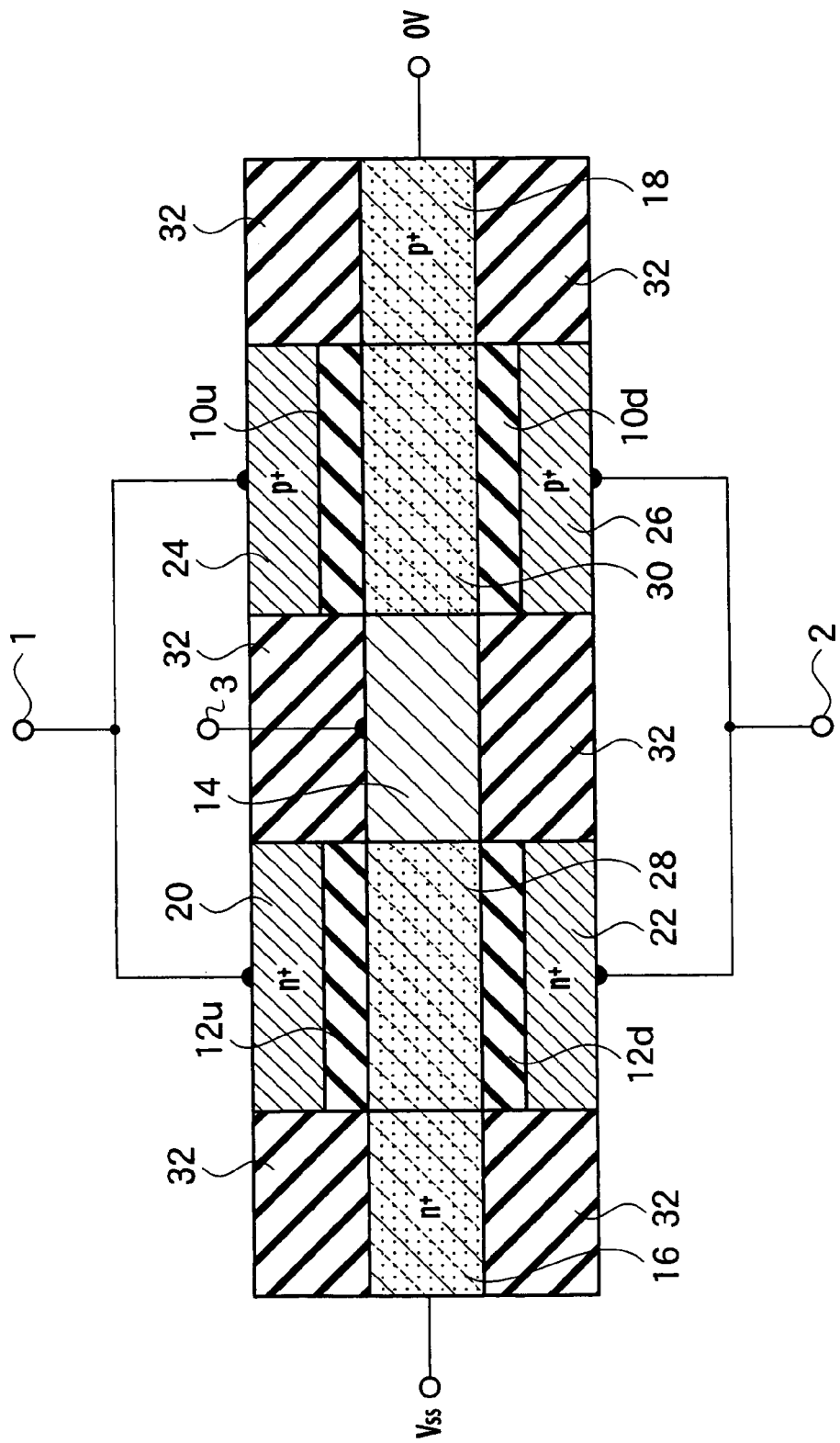
FIG. 6 shows a schematic cross-sectional structure of a semiconductor LSI circuit, according to a second embodiment of the present invention.

FIG. 6 shows a schematic cross-sectional structure of a semiconductor LSI circuit, according to the second embodiment of the present invention. The circuit includes a first semiconductor region 28, a first gate insulating layer 12u on one side of the first semiconductor region 28, a first gate electrode 20 on the first gate insulating layer 12u, a first source region 16 and a common drain region 14 arranged to sandwich the first semiconductor region 28, a second gate insulating layer 12d under the other side of the first semiconductor region 28, a second gate electrode 22 under the second gate insulating layer 12d, a second semiconductor region 30 adjacent to the common drain region 14, a third gate insulating layer 10u on one side of the second semiconductor region 30, a third gate electrode 24 on the third gate insulating layer 10u, a second source region 18 adjacent to the second semiconductor region 30 and formed to face the common drain region 14, a fourth gate insulating layer 10d under the other side of the second semiconductor region 30, and a fourth gate electrode 26 under the fourth gate insulating layer 10d. The first semiconductor region 28, the first gate insulting layer 12u, the first gate electrode 20, the first source region 16, and the common drain region 14 constitute a first transistor N3. The first semiconductor region 28, the second gate insulting layer 12d, the second gate electrode 22, the first source region 16, and the common drain region 14 constitute a second transistor N4. The second semiconductor region 30, the third gate insulating layer 10u, the third gate electrode 24, the second source region 18, and the common drain region 14 constitute a third transistor P3. The second semiconductor region 30, the fourth gate insulating layer 10d, the fourth gate electrode 26, the second source region 18, and the common drain region 14 constitute a fourth transistor P4.

When a certain voltage is applied to the first gate electrode 20, a first conductive channel is generated for the first transistor N3 in the first semiconductor region 28. When a certain voltage is applied to the second gate electrode 22, a first conductive channel is generated for the second transistor N4 in the first semiconductor region 28. When a certain voltage is applied to the third gate electrode 24, a second conductive channel is generated for the third transistor P3 in the second semiconductor region 30. When a certain voltage is applied to the fourth gate electrode 26, a second conductive channel is generated for the fourth transistor P4 in the second semiconductor region 30.

Three different potentials: a high potential $V_{DD}$, an intermediate potential (e.g., 0 V), lower than the high potential $V_{DD}$, and a low potential $V_{SS}$ lower than the intermediate potential are provided. The intermediate potential is applied to the second source region 18 while the low potential $V_{SS}$ is applied to the first source region 16. The first through the fourth transistor N3, N4, P3, and P4 constitutes a NOR gate.

A schematic cross-sectional structure of the semiconductor LSI circuit, according to the second embodiment of the present invention, is shown in FIG. 6. In the nMOSFETs and the pMOSFETs, the gate electrodes 20 and 22 are formed to face each other and sandwich the semiconductor region 28 via the gate insulating layers 12, while the gate electrodes 24 and 26 are formed to face each other and sandwich the semiconductor region 30 via the gate insulting layers 10, respectively. The common drain region 14 is made of a metallic material or a metallic compound and is shared by the nMOSFET and the pMOSFET. The intermediate potential (e.g., 0 V), lower than the high potential $V_{DD}$, is applied to the source region of the pMOSFET, while low potential $V_{SS}$ is applied to the source region 16 of the nMOSFET, constituting a NOR gate.

Figure 7:
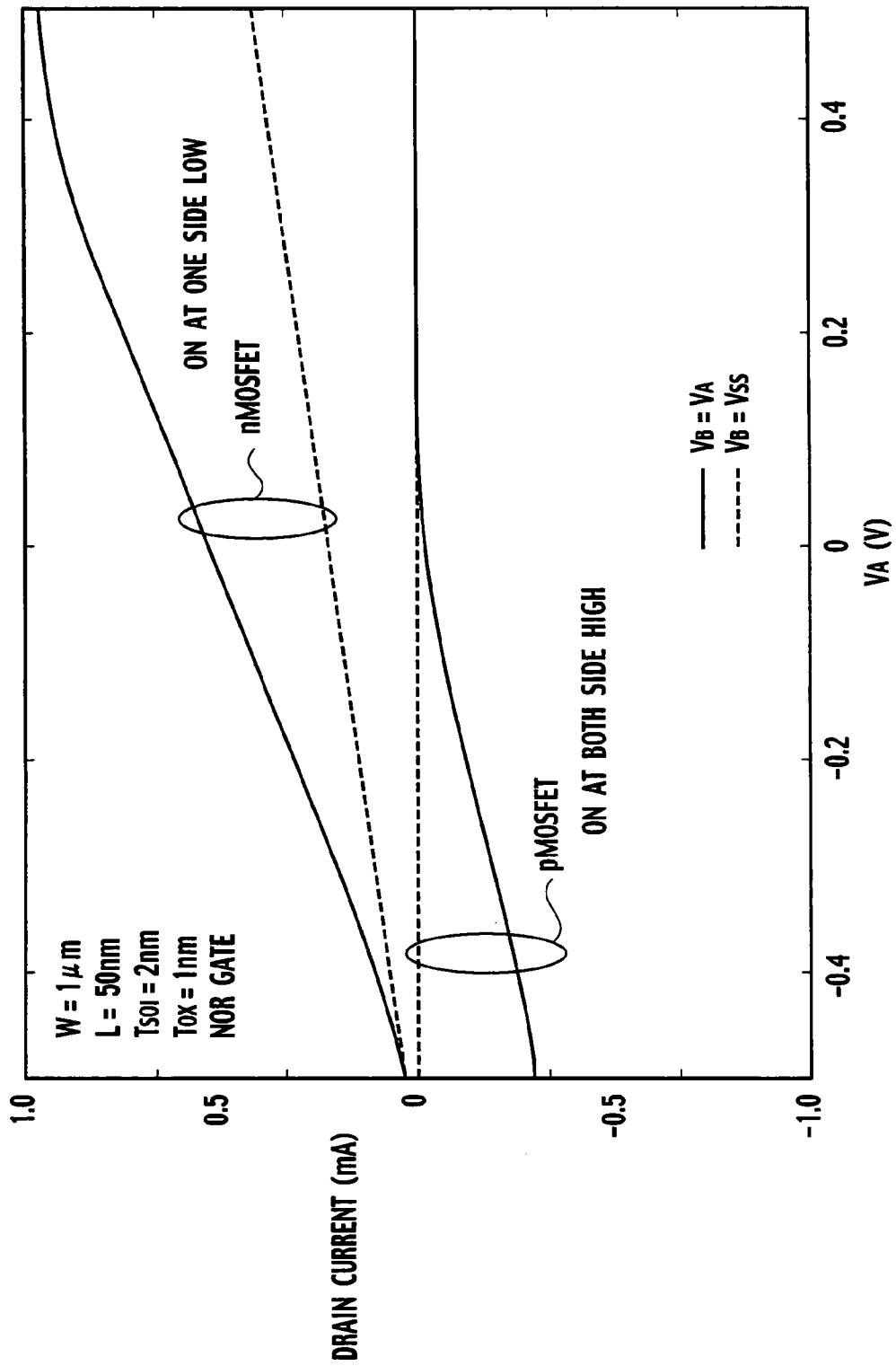
FIG. 7 is a graph showing current-voltage characteristics of an nMOSFET and a pMOSFET in FIG. 6.

FIG. 7 is a graph showing current-voltage characteristics of an nMOSFET and a pMOSFET in the semiconductor LSI circuit, according to the second embodiment of the present invention. Since the pMOSFET is turned on only when $V_B=V_A$, the same results are achieved as with the case of connecting pMOSFETs in series. On the other hand, since the nMOSFET is turned on in both cases, the same results are achieved as with the case of connecting nMOSFETs in parallel.

The common drain region 14 or a shared metallic region may be made of titanium silicide ($TiSi_2$), cobalt silicide ($CoSi_2$), nickel silicide (NiSi), platinum silicide (PtSi) erbium silicide ($ErSi_2$) or the like.

According to the semiconductor LSI circuit of the second embodiment of the present invention, NOR gates are formed within a small area, and a highly integrated and microscopic structure can be provided.

THIRD EMBODIMENT

Figure 8:
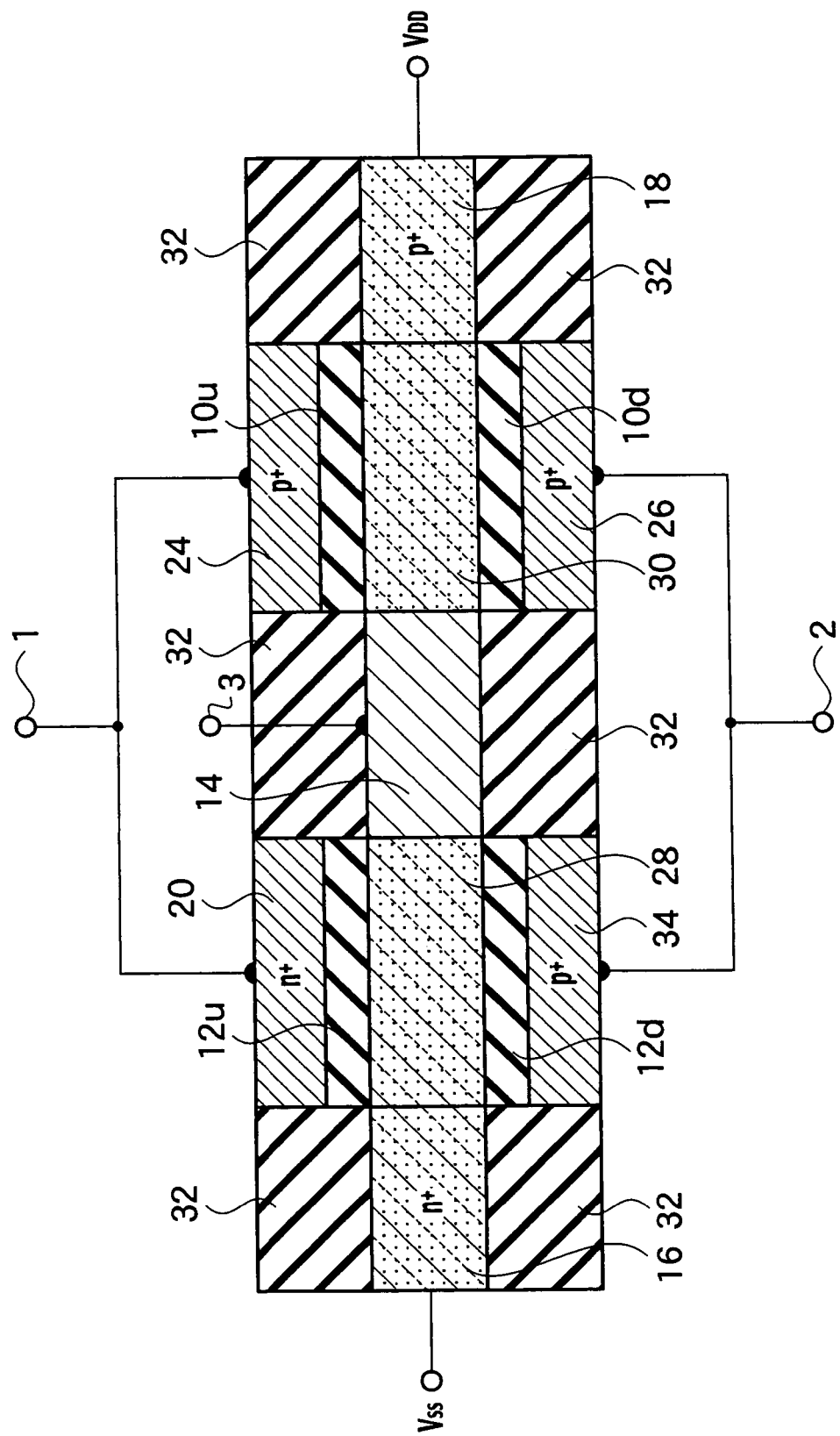
FIG. 8 shows a schematic cross-sectional structure of a semiconductor LSI circuit, according to a third embodiment of the present invention.

FIG. 8 shows a schematic cross-sectional structure of a semiconductor LSI circuit, according to the third embodiment of the present invention. The circuit includes a first semiconductor region 28, a first gate insulating layer 12u on one side of the first semiconductor region 28, a first gate electrode 20 on the first gate insulating layer 12u, a first source region 16 and a common drain region 14 arranged to sandwich the first semiconductor region 28, a second gate insulating layer 12d under the other side of the first semiconductor region 28, a second gate electrode 34 under the second gate insulating layer 12d, a second semiconductor region 30 adjacent to the common drain region 14, a third gate insulating layer 10u on one side of the second semiconductor region 30, a third gate electrode 24 on the third gate insulating layer 10u, a second source region 18 adjacent to the second semiconductor region 30 and formed to face the common drain region 14, a fourth gate insulating layer 10d under the other side of the second semiconductor region 30, and a fourth gate electrode 26 under the fourth gate insulating layer 10d. The first semiconductor region 28, the first gate insulting layer 12u, the first gate electrode 20, the first source region 16, and the common drain region 14 constitute a first transistor N1. The first semiconductor region 28, the second gate insulting layer 12d, the second gate electrode 34, the first source region 16, and the common drain region 14 constitute a second transistor N2. The second semiconductor region 30, the third gate insulting layer 10u, the third gate electrode 24, the second source region 18, and the common drain region 14 constitute a third transistor P1. The second semiconductor region 30, the fourth gate insulating layer 10d, the fourth gate electrode 26, the second source region 18, and the common drain region 14 constitute a fourth transistor P2.

When a certain voltage is applied to the first gate electrode 20, a first conductive channel is generated for the first transistor N1 in the first semiconductor region 28. When a certain voltage is applied to the second gate electrode 34, a first conductive channel is generated for the second transistor N2 in the first semiconductor region 28. When a certain voltage is applied to the third gate electrode 24, a second conductive channel is generated for the third transistor P1 in the second semiconductor region 30. When a certain voltage is applied to the fourth gate electrode 26, a second conductive channel is generated for the fourth transistor P2 in the second semiconductor region 30.

Two different potentials: a high potential $V_{DD}$ and a low potential $V_{SS}$, lower than the high potential $V_{DD}$, are provided. The high potential $V_{DD}$ is applied to the second source region 18 while the low potential $V_{SS}$ is applied to the first source region 16 to reduce the electron affinity of the second gate electrode 34. The first through the fourth transistor N1, N2, P1, and P2 constitute a NAND gate.

A schematic cross-sectional structure of the semiconductor LSI circuit, according to the third embodiment of the present invention, is shown in FIG. 8. In the nMOSFETs and the pMOSFETs, the gate electrodes 20 and 34 are formed to face each other and sandwich the semiconductor region 28 via the gate insulting layers 12 while the gate electrodes 24 and 26 are formed to face each other and sandwich the semiconductor region 30 via the gate insulating layers 10, respectively. The common drain region 14 is made of a metallic material or a metallic compound and is shared by the nMOSFET and the pMOSFET, the high potential $V_{DD}$ is applied to the source region of the pMOSFET while the low potential $V_{SS}$, lower than the high potential $V_{DD}$, is applied to the source region of the nMOSFET.

A NAND gate is structured with the electron affinity of the nMOSFET gate electrode 34 being smaller than that of the gate electrode 20. In other words, the semiconductor LSI circuit according to the third embodiment of the present invention, shown in FIG. 8, has one nMOSFET gate electrode 34 made of $p^+$ polysilicon and the other nMOSFET gate electrode 20 made of $n^+$ polysilicon. Such structure provides for a smaller electron affinity of the nMOSFET gate electrode 34 than the other nMOSFET gate electrode 20. As described above, such smaller electron affinity of one nMOSFET gate achieves the same results as with the case of connecting nMOSFETs in series.

Figure 9:
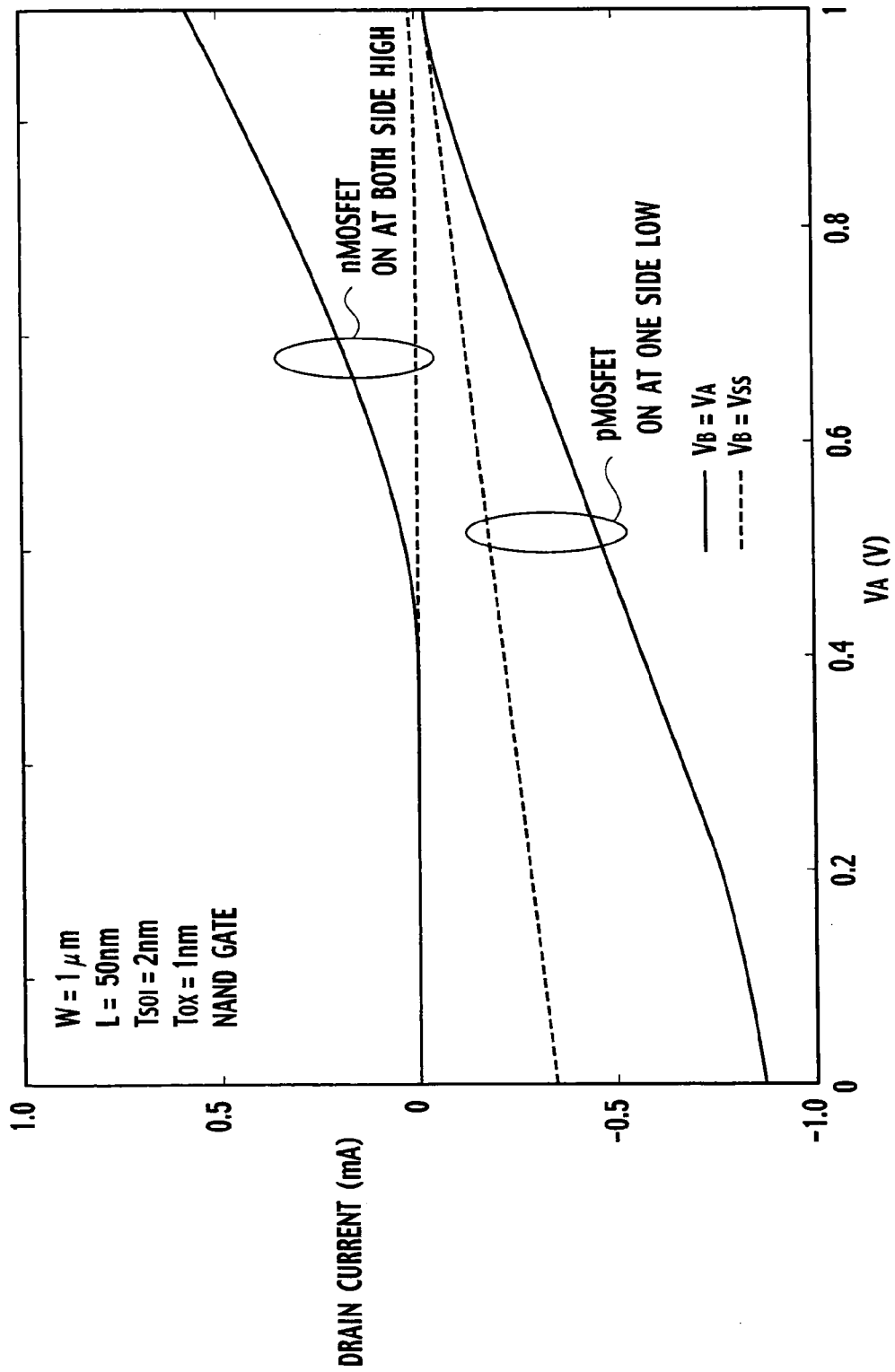
FIG. 9 is a graph showing current-voltage characteristics of an nMOSFET and a pMOSFET in FIG. 8.

FIG. 9 is a graph showing current-voltage characteristics of an nMOSFET and a pMOSFET in the semiconductor LSI circuit, according to the third embodiment of the present invention. Since the pMOSFET is turned on in both cases, the same results may be achieved as with the case of connecting pMOSFETs in parallel. On the other hand, since the nMOSFET is turned on only when $V_B=V_A$, the same results may be achieved as with the case of connecting nMOSFETs in series.

The common drain region 14 or a shared metallic region may be made of titanium silicide ($TiSi_2$), cobalt silicide ($CoSi_2$), nickel silicide (NiSi), platinum silicide (PtSi) erbium silicide ($ErSi_2$) or the like.

According to the semiconductor LSI circuit of the third embodiment of the present invention, NAND gates are formed within a small area, and a highly integrated and microscopic structure can be provided.

FOURTH EMBODIMENT

Figure 10:
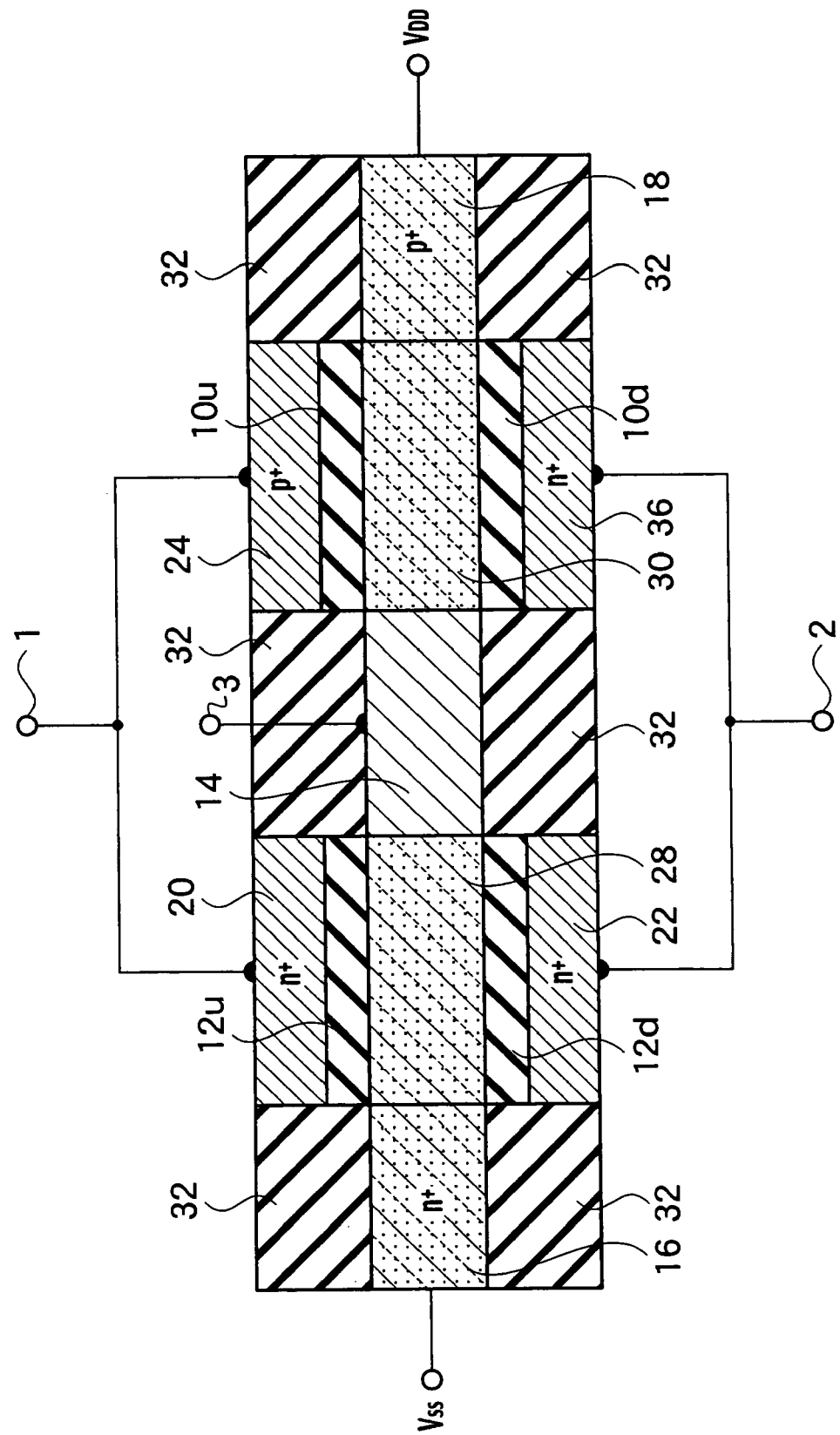
FIG. 10 shows a schematic cross-sectional structure of a semiconductor LSI circuit, according to a fourth embodiment of the present invention.

FIG. 10 shows a schematic cross-sectional structure of a semiconductor LSI circuit, according to the fourth embodiment of the present invention. The circuit includes a first semiconductor region 28, a first gate insulating layer 12u on one side of the first semiconductor region 28, a first gate electrode 20 on the first gate insulating layer 12u, a first source region 16 and a common drain region 14 which are arranged to sandwich the first semiconductor region 28, a second gate insulating layer 12d under the other side of the first semiconductor region 28, a second gate electrode 22 under the second gate insulating layer 12d, a second semiconductor region 30 adjacent to the common drain region 14, a third gate insulating layer 10u on one side of the second semiconductor region 30, a third gate electrode 24 on the third gate insulating layer 10u, a second source region 18 which is adjacent to the second semiconductor region 30 and formed to face the common drain region 14, a fourth gate insulating layer 10d under the other side of the second semiconductor region 30, and a fourth gate electrode 36 under the fourth gate insulating layer 10d. The first semiconductor region 28, the first gate insulting layer 12u, the first gate electrode 20, the first source region 16, and the common drain region 14 constitute a first transistor N3. The first semiconductor region 28, the second gate insulting layer 12d, the second gate electrode 22, the first source region 16, and the common drain region 14 constitute a second transistor N4. The second semiconductor region 30, the third gate insulating layer 10u, the third gate electrode 24, the second source region 18, and the common drain region 14 constitute a third transistor P3. The second semiconductor region 30, the fourth gate insulating layer 10d, the fourth gate electrode 36, the second source region 18, and the common drain region 14 constitute a fourth transistor P4.

Two different potentials: a high potential $V_{DD}$ and a low potential $V_{SS}$, lower than the high potential $V_{DD}$, are provided. The high potential $V_{DD}$ is applied to the second source region 18 while the low potential $V_{SS}$ is applied to the first source region 16 to increase the electron affinity of the fourth gate electrode 36. The first through the fourth transistor N3, N4, P3, and P4 constitute a NOR gate.

A schematic cross-sectional structure of the semiconductor LSI circuit, according to the fourth embodiment of the present invention, is shown in FIG. 10. In the nMOSFETs and the pMOSFETs, the gate electrodes 20 and 22 are formed to face each other and sandwich the semiconductor region 28 via the gate insulting layers 12 while the gate electrodes 24 and 36 are formed to face each other and sandwich the semiconductor region 30 via the gate insulting layers 10, respectively. The common drain region 14 is made of a metallic material or a metallic compound and is shared by the nMOSFET and the pMOSFET. The high potential $V_{DD}$ is applied to the source region of the pMOSFET while low potential $V_{SS}$, lower than the high potential $V_{DD}$, is applied to the source region of the nMOSFET.

A NOR gate is structured with the electron affinity of the pMOSFET gate electrode 36 being larger than that of the gate electrode 24. In other words, the semiconductor LSI circuit according to the fourth embodiment of the present invention, shown in FIG. 10, has one pMOSFET gate electrode 36 made of $n^+$ polysilicon and the other pMOSFET gate electrode 24 made of $p^+$ polysilicon. Such structure permits a larger electron affinity of the pMOSFET gate electrode 36 than the other pMOSFET gate electrode 24. As described above, such larger electron affinity of one pMOSFET gate achieves the same results as with the case of connecting pMOSFETs in series.

Figure 11:
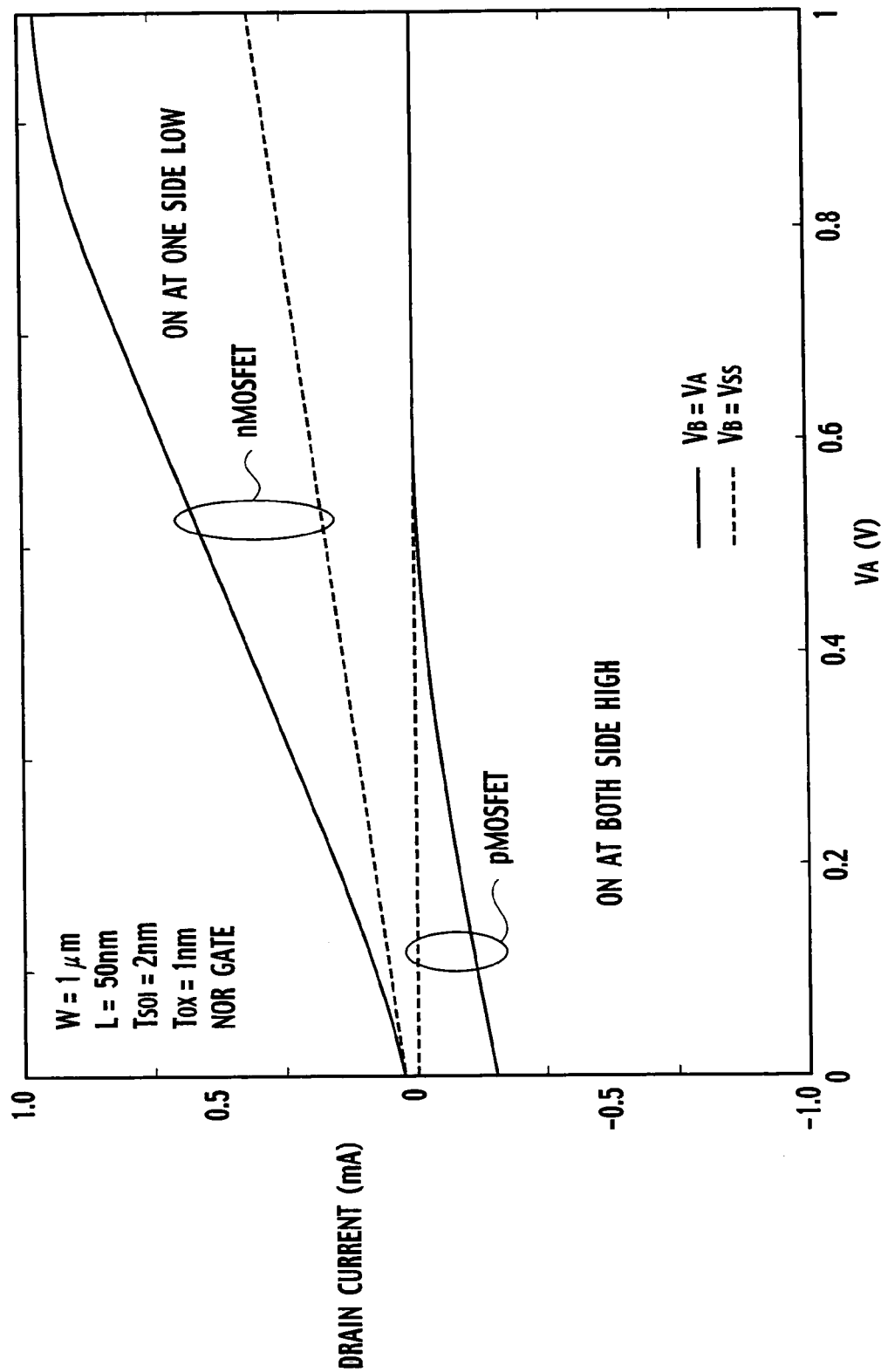
FIG. 11 is a graph showing current-voltage characteristics of an nMOSFET and a pMOSFET in FIG. 10.

FIG. 11 is a graph showing current-voltage characteristics of an nMOSFET and a pMOSFET in the semiconductor LSI circuit, according to the fourth embodiment of the present invention. Since the pMOSFET is turned on only when $V_B=V_A$, the same results may be achieved as with the case of connecting pMOSFETs in series. On the other hand, since the nMOSFET is turned on in both cases, the same results may be achieved as with the case of connecting nMOSFETs in parallel.

The common drain region 14 or a shared metallic region may be made of titanium silicide ($TiSi_2$), cobalt silicide ($CoSi_2$), nickel silicide (NiSi), platinum silicide (PtSi) erbium silicide ($ErSi_2$) or the like.

According to the semiconductor LSI circuit of the fourth embodiment of the present invention, NOR gates are formed within a small area, and a highly integrated and microscopic structure can be provided.

(Fabrication Method)

Figure 12:
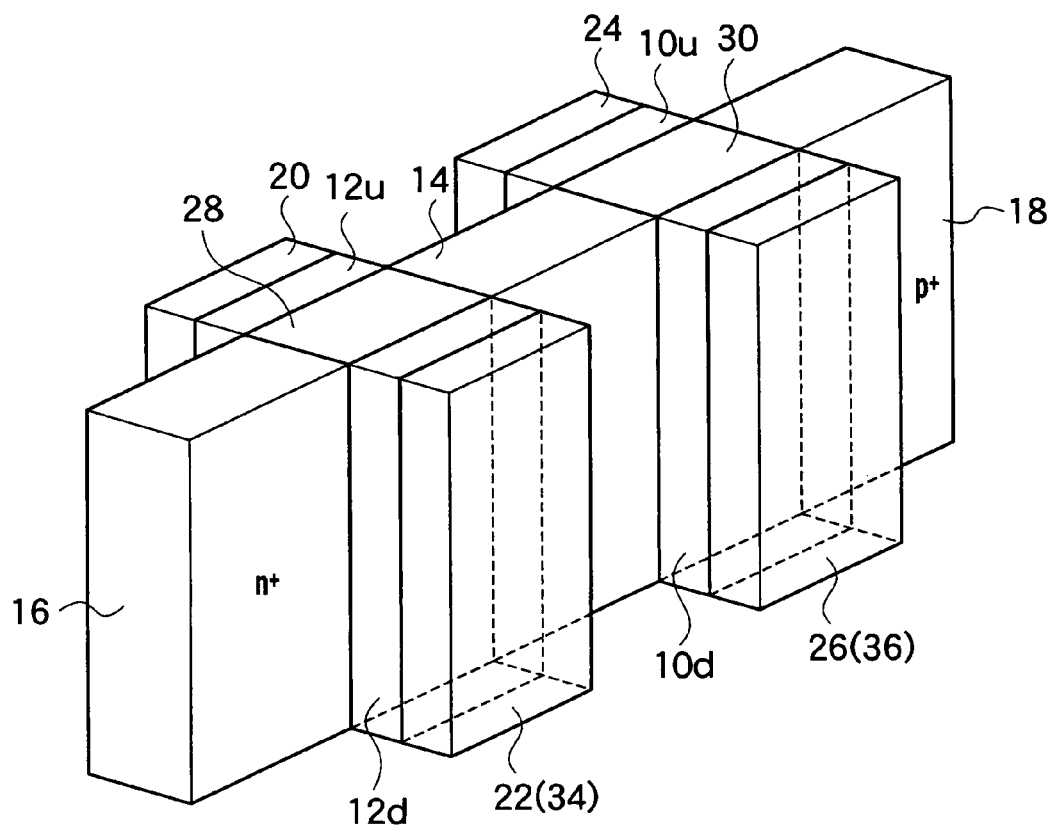
FIG. 12 shows a bird's eye view of a device structure of the semiconductor LSI circuit, according to the first through the fourth embodiment of the present invention.

A bird's eye view of a device structure of the semiconductor LSI circuit, according to the first through the fourth embodiment of the present invention, is shown in FIG. 12. An exemplary fabrication process for providing a device structure of the semiconductor LSI circuit, according to the first through the fourth embodiment of the present invention, is described while referencing FIGS. 13A through 13F.

Figure 13:
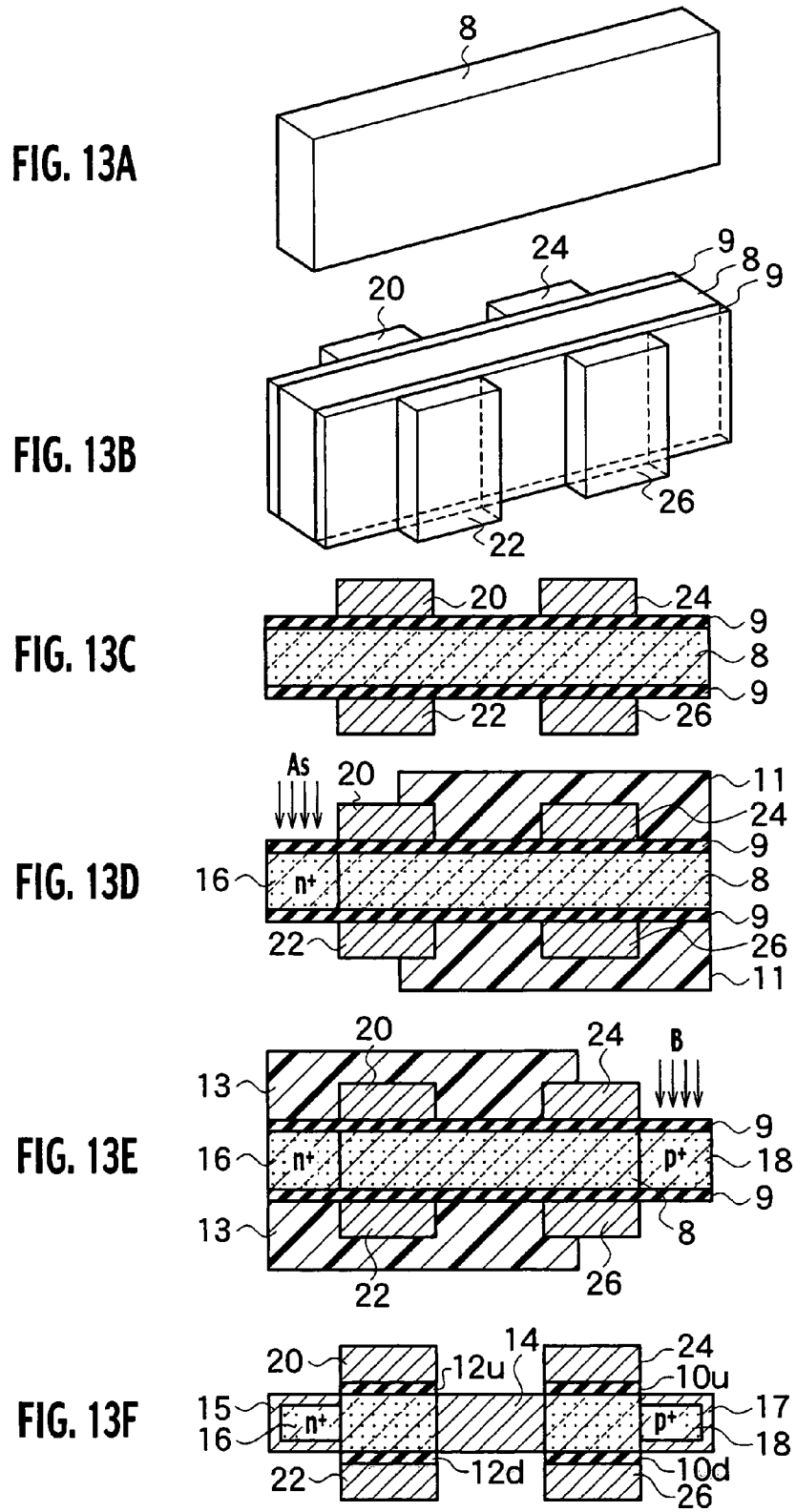
FIG. 13A is a diagram describing an exemplary fabrication process for providing a device structure or a tabular semiconductor layer 8 of the semiconductor LSI circuit, according to the first through the fourth embodiment of the present invention.
FIG. 13B is a diagram describing formation of a gate insulating layer 9.
FIG. 13C is a diagram describing deposition of a gate electrode material and then formation of nMOSFET gate electrodes 20 and 22 and pMOSFET gate electrodes 24 and 26.
FIG. 13D is a diagram describing patterning of a resist 11 and then formation of an n⁺ source region 16.
FIG. 13E is a diagram describing patterning of a resist 13 and then formation of a p⁺ source region 18.
FIG. 13F is a process describing removal of an exposed gate insulating layer 9, deposition of a metallic material, and then formation of metal silicide 15 and 17.

As shown in FIG. 13A, a semiconductor layer 8 is first deposited on an insulating substrate (not shown in the drawing) and then a tabular semiconductor layer 8 is formed through reactive ion etching (RIE).

Afterwards, as shown in FIG. 13B, gate insulating layers 9 are formed on the respective surfaces of the semiconductor layer 8 by thermal oxidation or deposition.

As shown in FIGS. 13B and 13C, a gate electrode material such as polycrystalline silicon or a metallic material is deposited. Afterwards, nMOSFET gate electrodes 20 and 22 and pMOSFET gate electrodes 24 and 26 are formed by RIE. FIG. 13C is a cross-sectional view of FIG. 13B when seen from above.

Afterwards, as shown in FIG. 13D, a resist 11 is patterned. An $n^+$ source region 16 is then formed by doping donor impurities, such as arsenic (As), by ion implantation, solid phase diffusion, or vapor phase diffusion.

Afterwards, as shown in FIG. 13E, a resist 13 is patterned. A $p^+$ source region 18 is then formed by doping acceptor impurities, such as boron (B), by ion implantation, solid phase diffusion, or vapor phase diffusion.

As shown in FIG. 13F, exposed gate insulating layers 9 are removed. The $n^+$ source region 16 and the $p^+$ source region 18 are then activated by depositing and heating a metallic material such as titanium (Ti) or cobalt (Co). At the same time, metal silicides 15 and 17 are formed on the exposed surfaces of the semiconductor layers, and a metallic material which has not reacted to the silicide is then removed.

The metal silicide regions 15 and 17 may be made of titanium silicide ($TiSi_2$), cobalt silicide ($CoSi_2$), nickel silicide (NiSi), platinum silicide (PtSi), erbium silicide ($ErSi_2$) or the like.

FIFTH EMBODIMENT

Figure 14:
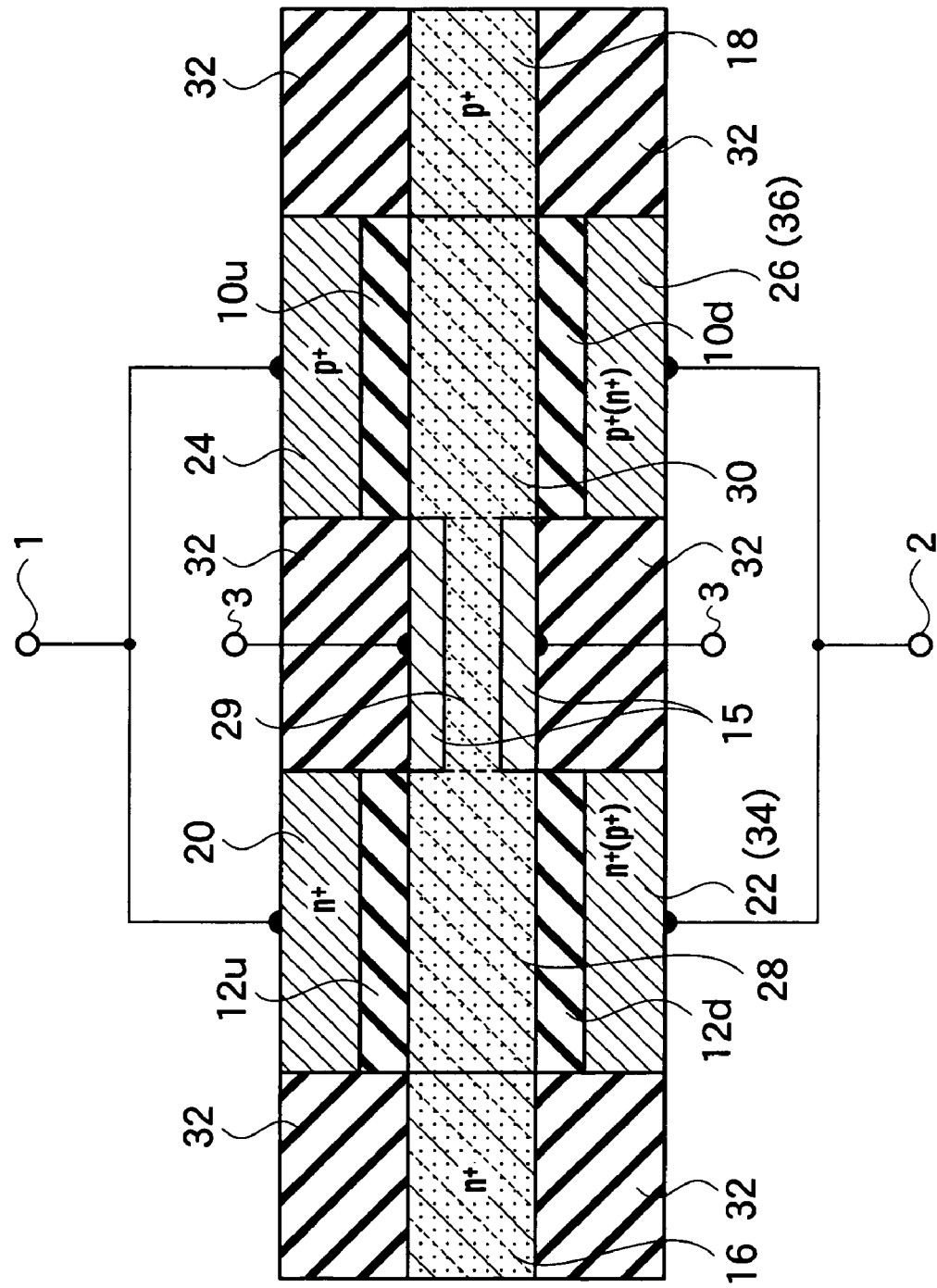
FIG. 14 shows a schematic cross-sectional structure of a semiconductor LSI circuit, according to a fifth embodiment of the present invention.

A schematic cross-sectional structure of a semiconductor LSI circuit, according to the fifth embodiment of the present invention, is shown in FIG. 14. The semiconductor LSI circuit, according to the fifth embodiment of the present invention, is fabricated by forming metal silicide regions 15 on the surfaces of a common drain region 29 of the first through fourth embodiment. As shown in FIG. 14, since the semiconductor LSI circuit, according to the fifth embodiment of the present invention, has the metal silicide regions 15 only on the surfaces of the common drain region 29, the metal silicide regions 15 may be formed by a short thermal treatment. This process may effectively suppress redundant impurity diffusion.

The metal silicide regions 15 may be made of titanium silicide ($TiSi_2$), cobalt silicide ($CoSi_2$), nickel silicide (NiSi), platinum silicide (PtSi), erbium silicide ($ErSi_2$) or the like.

Potentials to be applied to the $n^+$ source region 16 and the $p^+$ source region 18, which are not shown in FIG. 14, may be specified as with the first through the fourth embodiment of the present invention. In addition, needless to say, a smaller electron affinity of one nMOSFET gate achieves the same results as with the case of connecting nMOSFETs in series while a larger electron affinity of one pMOSFET gate achieves the same results as with the case of connecting pMOSFETs in series. As a result, use of the structure of the semiconductor LSI circuit, according to the fifth embodiment of the present invention, provides a NAND gate as shown in FIG. 4 or FIG. 8, or a NOR gate as shown in FIG. 6 or FIG. 10.

According to the semiconductor LSI circuit of the fifth embodiment of the present invention, NAND or NOR gates are formed within a small area, and a highly integrated and microscopic structure can be provided.

SIXTH EMBODIMENT

Figure 15:
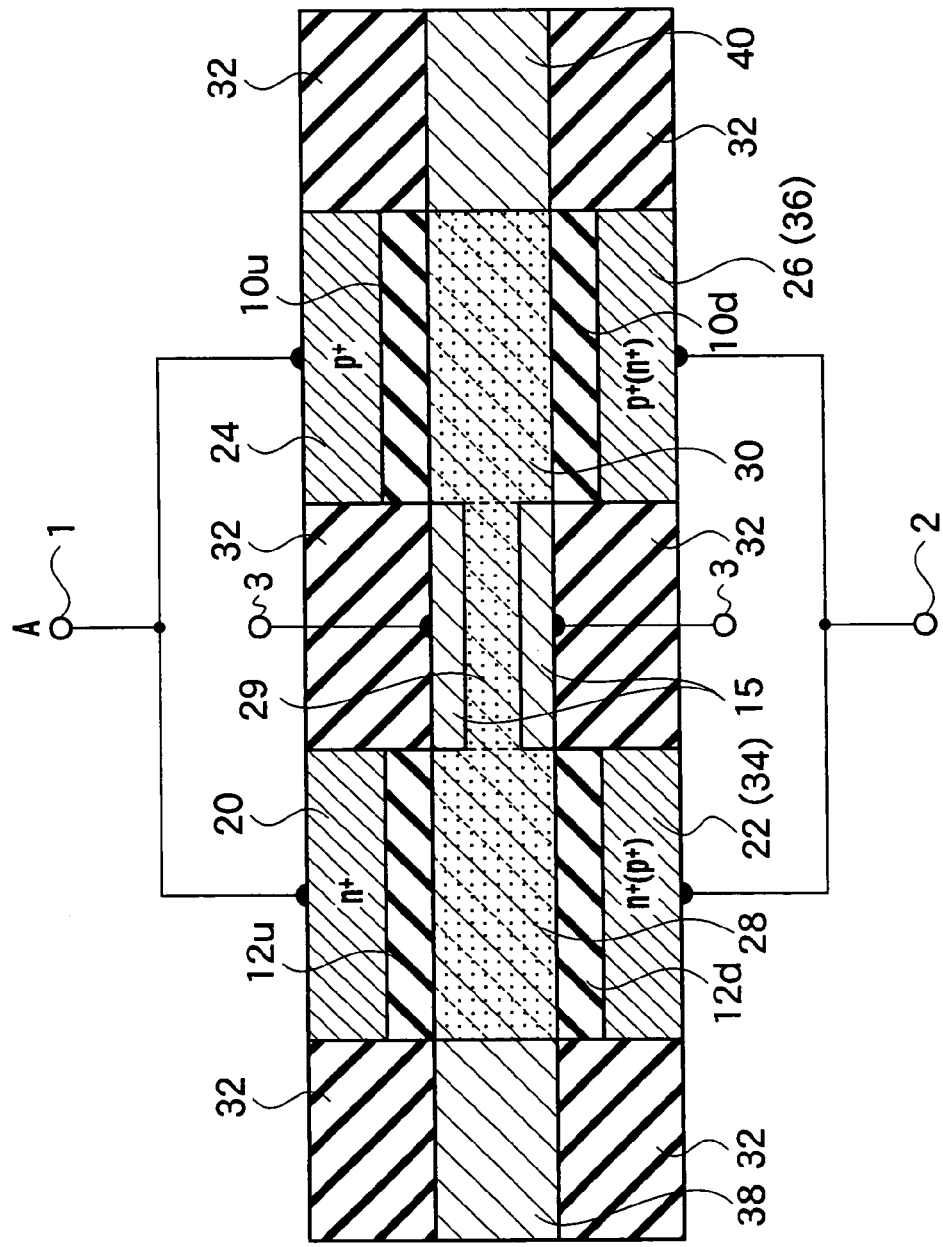
FIG. 15 shows a schematic cross-sectional structure of a semiconductor LSI circuit, according to a sixth embodiment of the present invention.

A schematic cross-sectional structure of a semiconductor LSI circuit, according to the sixth embodiment of the present invention, is shown in FIG. 15. The semiconductor LSI circuit, according to the sixth embodiment of the present invention, is fabricated by forming an erbium silicide ($ErSi_2$) region 38 as the nMOSFET source region of the first through the fourth embodiment, thereby providing the nMOSFET source region with a smaller electron affinity than the semiconductor region. Since the nMOSFET source region made of erbium silicide ($ErSi_2$) provides a low barrier to electrons, the nMOSFET driving capability may be enhanced. Furthermore, formation of a pMOSFET source region 40 of platinum silicide (PtSi) provides the pMOSFET source region with a larger electron affinity than the semiconductor region.

The semiconductor LSI circuit, according to the sixth embodiment of the present invention, is fabricated by forming metal silicide regions 15 on the surfaces of a common drain region 29 of the first through the fourth embodiment. As shown in FIG. 15, since the semiconductor LSI circuit, according to the sixth embodiment of the present invention, has the metal silicide regions 15 only on the surfaces of the common drain region 29, the metal silicide regions 15 may be formed by a short thermal treatment. This process may effectively suppress redundant impurity diffusion.

The metal silicide regions 15 may be made of titanium silicide ($TiSi_2$), cobalt silicide ($CoSi_2$), nickel silicide (NiSi), platinum silicide (PtSi), erbium silicide ($ErSi_2$) or the like.

The structure of the semiconductor LSI circuit, according to the sixth embodiment of the present invention, further suppresses short-channel effects compared to the case of forming the semiconductor region 16 or 18 by doping impurities in a source region.

Potentials to be applied to the $ErSi_2$ region 38 and the PtSi region 40, which are not shown in FIG. 15, may be specified as with the first through the fourth embodiment of the present invention. In addition, needless to say, a smaller electron affinity of one nMOSFET gate achieves the same results as with the case of connecting nMOSFETs in series and a larger electron affinity of one pMOSFET gate achieves the same results as with the case of connecting pMOSFETs in series. As a result, use of the structure of the semiconductor LSI circuit, according to the sixth embodiment of the present invention, provides a NAND gate as shown in FIG. 4 or FIG. 8, or a NOR gate as shown in FIG. 6 or FIG. 10.

According to the semiconductor LSI circuit of the sixth embodiment of the present invention, NAND or NOR gates are formed within a small area, and a highly integrated and microscopic structure with less short-channel effects can be provided.

SEVENTH EMBODIMENT

Figure 16:
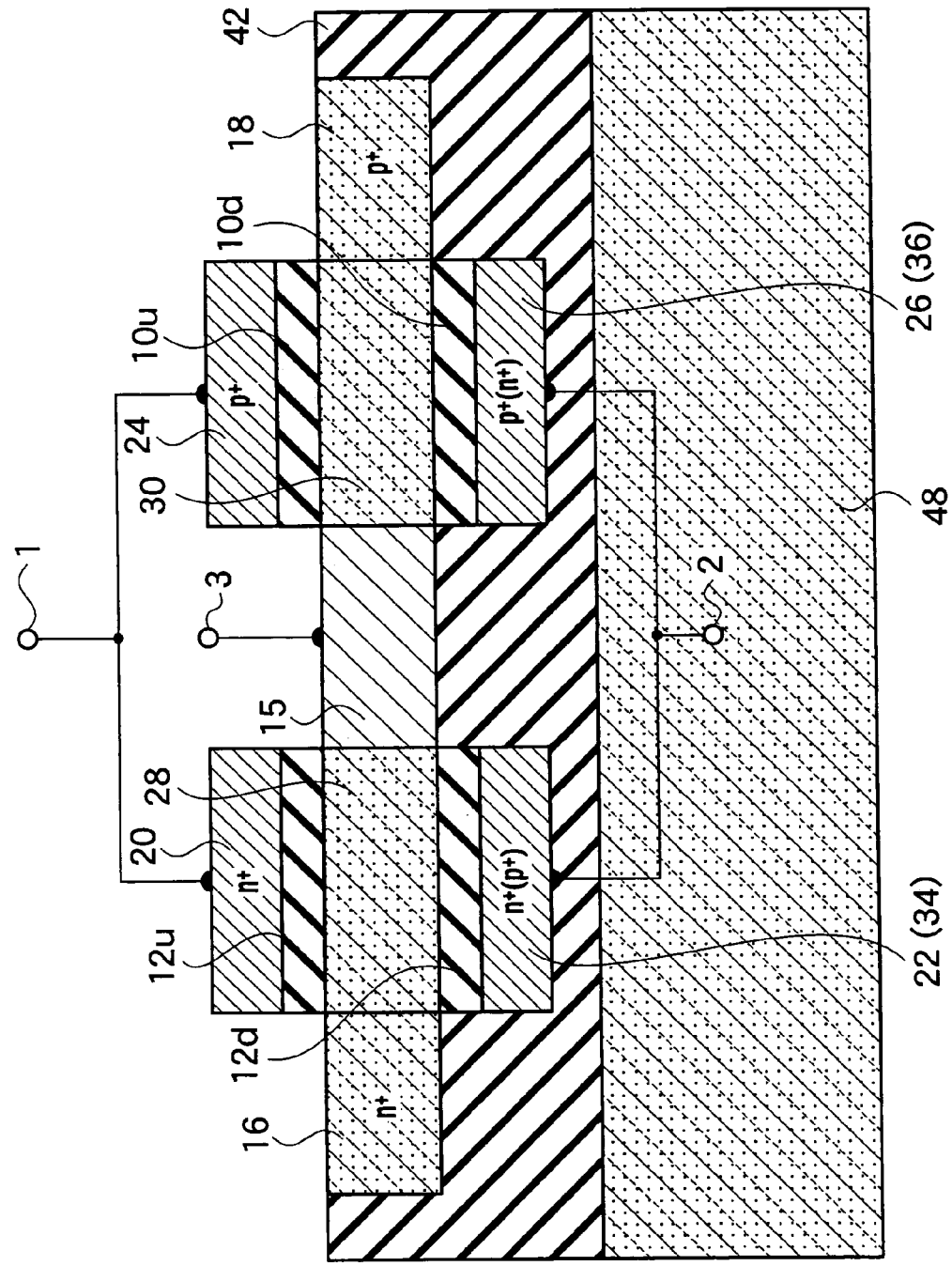
FIG. 16 shows a schematic cross-sectional structure of a semiconductor LSI circuit, according to a seventh embodiment of the present invention.

A schematic cross-sectional structure of a semiconductor LSI circuit, according to the seventh embodiment of the present invention, is shown in FIG. 16. The semiconductor LSI circuit, according to the seventh embodiment of the present invention, has first and second semiconductor regions 28 and 30 formed on an insulator 42, which is formed on a semiconductor substrate 48.

The semiconductor LSI circuit, according to the seventh embodiment of the present invention, has a silicon-on-insulator (SOI) structure fabricated by forming the semiconductor regions 28 and 30 on the semiconductor substrate 48 via the insulator 42, and gate electrodes 20, 22 (34), 24, and 26 (36) on and under the semiconductor regions 28 and 30 via insulating layers 10 and 12 of the first through the fourth embodiment.

More specifically, the first and the second semiconductor region are formed on the insulator 42, which is formed on the semiconductor substrate 48. A first gate insulating layer 12$u$, a first gate electrode 20, a second gate insulating layer 12$d$, and a second gate electrode 22 (34) are stacked on the insulator 42. A third gate insulating layer 10$u$, a third gate electrode 24, a fourth gate insulating layer 10$d$, and a fourth gate electrode 26 (36) are stacked on the insulator 42.

The semiconductor LSI circuit according to this embodiment has a lower degree of integration when compared to the first through the sixth embodiment of the present invention. However, the present embodiment reduces the processing burden in fabrication steps such as lithography, polishing, and formation of interlayer films.

Potentials to be applied to the n$^+$ source region 16 and the p$^+$ source region 18, which are not shown in FIG. 16, may be specified as with the first through the fourth embodiment of the present invention. In addition, needless to say, a smaller electron affinity of one nMOSFET gate achieves the same results as with the case of connecting nMOSFETs in series, while a larger electron affinity of one pMOSFET gate achieves the same results as with the case of connecting pMOSFETs in series. As a result, use of the structure of the semiconductor LSI circuit, according to the seventh embodiment of the present invention, provides a NAND gate as shown in FIG. 4 or FIG. 8, or a NOR gate as shown in FIG. 6 or FIG. 10.

Metal silicide regions 15 may be made of titanium silicide (TiSi$_2$), cobalt silicide (CoSi$_2$), nickel silicide (NiSi), platinum silicide (PtSi), erbium silicide (ErSi$_2$) or the like.

According to the semiconductor LSI circuit of the seventh embodiment of the present invention, NAND or NOR gates can be formed in a small area, and a highly integrated and microscopic structure can be provided using an SOI structure.

EIGHTH EMBODIMENT

Figure 17:
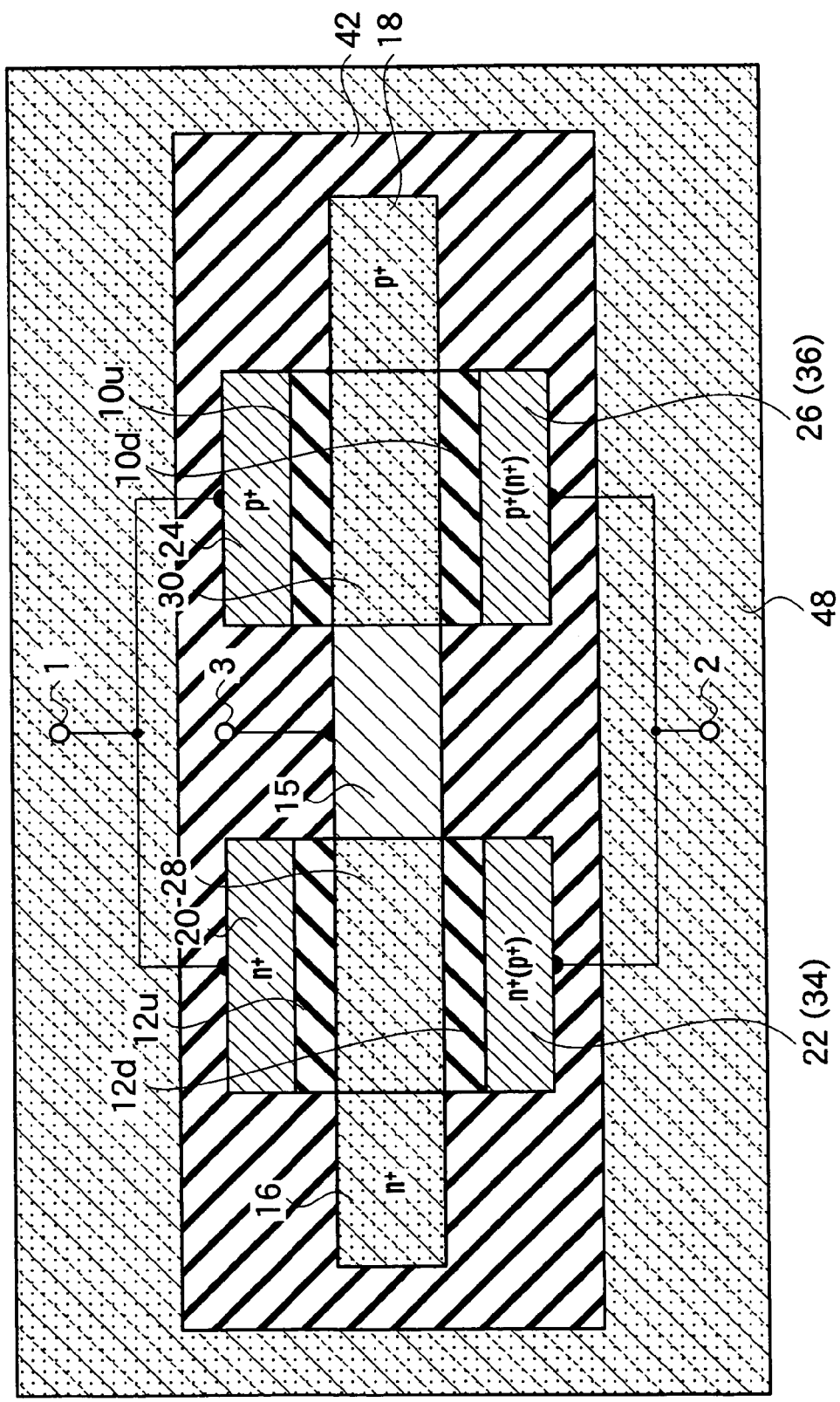
FIG. 17 shows a schematic cross-sectional structure of a semiconductor LSI circuit, according to an eighth embodiment of the present invention.

FIG. 17 shows a schematic cross-sectional structure of a semiconductor LSI circuit, according to the eighth embodiment of the present invention. The structure includes a boat-shaped insulator 42 buried in a semiconductor substrate 48. A first source region 16, a first gate electrode 20, a common drain region 14, a third gate electrode 24, a second source region 18, a fourth gate electrode 26 (34), and a second gate electrode 22 (34) are enclosed by the insulator 42.

The semiconductor LSI circuit, according to the eighth embodiment of the present invention, is fabricated by burying semiconductor regions 28 and 30 to be enclosed by the boat-shaped insulator 42, and forming the gate electrodes 20, 22 (34), 24, and 26 (36) on both surfaces of the semiconductor regions 28 and 30 via respective gate insulating layers 10 and 12 of the first through the fourth embodiment.

Since the surface of the semiconductor substrate 48 of the semiconductor LSI circuit according to this embodiment is flatter than the surfaces of the first through the sixth embodiment of the present invention, the processing burden for fabrication steps, such as polishing and formation of interlayer films, is reduced.

Potentials to be applied to the n$^+$ source region 16 and the p$^+$ source region 18, which are not shown in FIG. 17, may be specified as with the first through the fourth embodiment of the present invention. In addition, needless to say, a smaller electron affinity of one nMOSFET gate achieves the same results as with the case of connecting nMOSFETs in series, while a larger electron affinity of one PMOSFET gate achieves the same results as with the case of connecting pMOSFETs in series. As a result, use of the structure of the semiconductor LSI circuit, according to the eighth embodiment of the present invention, provides a NAND gate as shown in FIG. 4 or FIG. 8, or a NOR gate as shown in FIG. 6 or FIG. 10.

Metal silicide regions 15 may be made of titanium silicide (TiSi$_2$), cobalt silicide (CoSi$_2$), nickel silicide (NiSi), platinum silicide (PtSi), erbium silicide (ErSi$_2$) or the like.

According to the semiconductor LSI circuit of the eighth embodiment of the present invention, NAND or NOR gates with an SOI structure are formed in a small area, and a highly integrated and microscopic structure can be provided while maintaining excellent flatness of the structure.

NINTH EMBODIMENT

Figure 18:
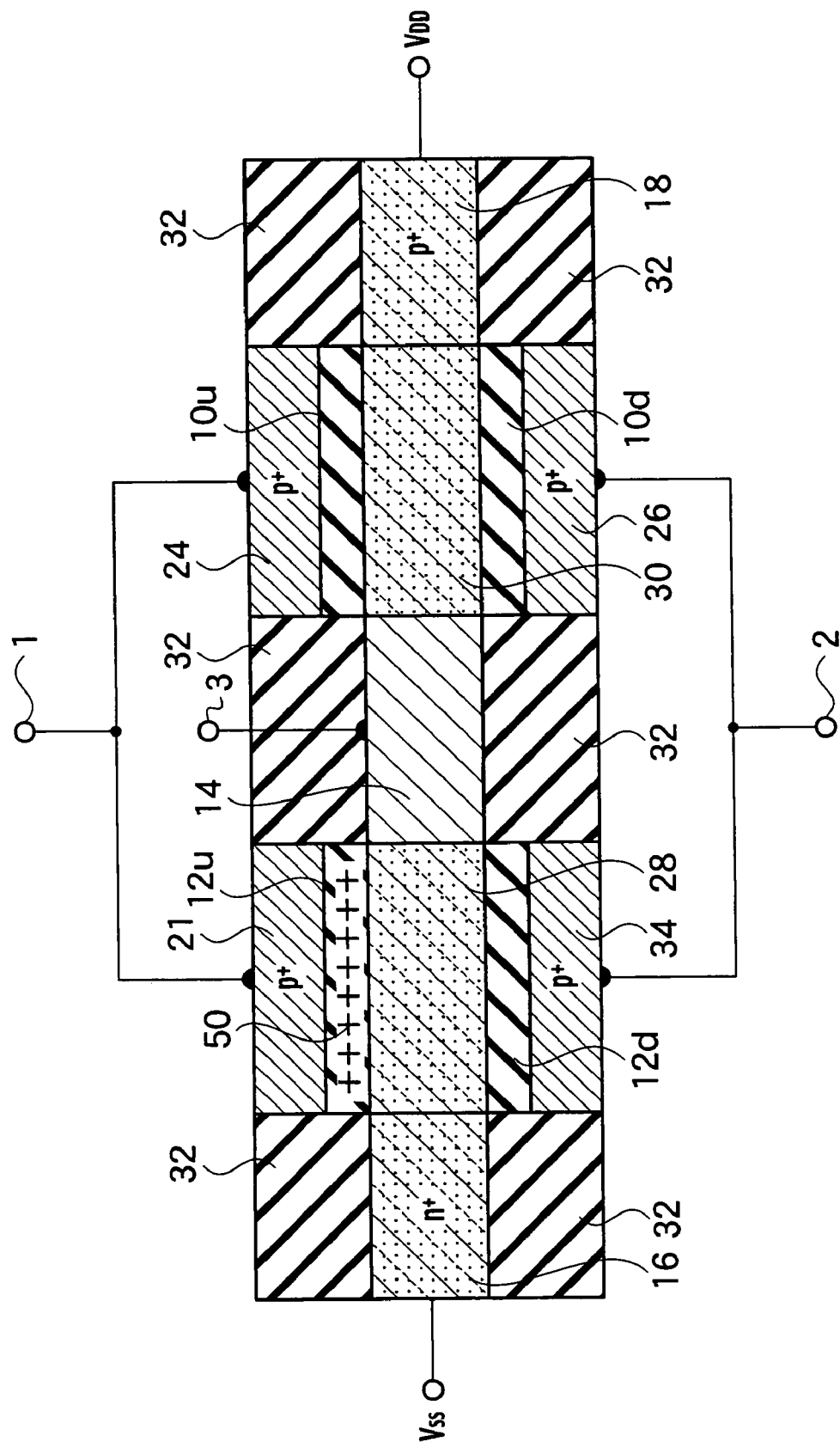
FIG. 18 shows a schematic cross-sectional structure of a semiconductor LSI circuit, according to a ninth embodiment of the present invention.

A schematic cross-sectional structure of a semiconductor LSI circuit, according to the ninth embodiment of the present invention, is shown in FIG. 18. According to the semiconductor LSI circuit of the ninth embodiment of the present invention, a first through a fourth transistor have gate electrodes 21, 34, 24, and 26 made of p$^+$ polysilicon, and fixed positive charges 50 are provided in a gate insulating layer 12$u$ on one nMOSFET. More specifically, the present invention is different from the semiconductor LSI circuit according to the third embodiment, shown in FIG. 8, in that the first gate electrode 21 is made of p$^+$ polysilicon and fixed positive charges 50 are provided in the first gate insulating layer 12$u$. Since the threshold for one nMOSFET is decreased due to the fixed positive charges 50, the same characteristics as the current-voltage characteristics of the nMOSFETs and the pMOSFETs shown in FIG. 9 may be achieved. Since the pMOSFET is turned on in both cases, the same results may be achieved as with the case of connecting pMOSFETs in parallel. On the other hand, since the nMOSFET is turned on only when $V_B=V_A$, the same results may be achieved as with the case of connecting nMOSFETs in series. In other words, NAND gates may be provided.

A common drain region 14 or a shared metallic region may be made of titanium silicide ($TiSi_2$), cobalt silicide ($CoSi_2$), nickel silicide (NiSi), platinum silicide (PtSi) erbium silicide ($ErSi_2$) or the like.

According to the semiconductor LSI circuit of the ninth embodiment of the present invention, NAND gates are formed within a small area, and a highly integrated and microscopic structure can be provided.

TENTH EMBODIMENT

Figure 19:
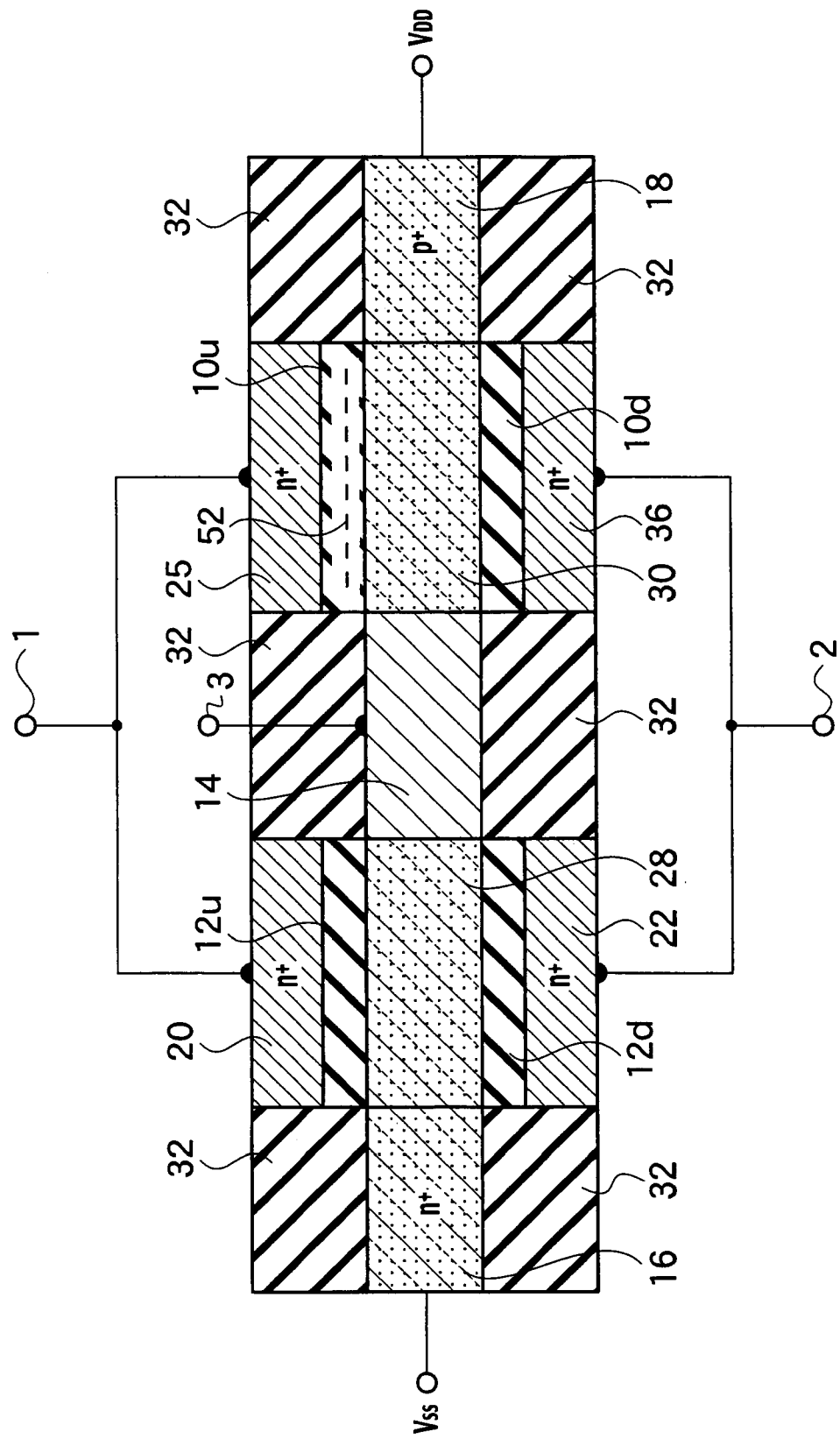
FIG. 19 shows a schematic cross-sectional structure of a semiconductor LSI circuit, according to a tenth embodiment of the present invention.

A schematic cross-sectional structure of a semiconductor LSI circuit, according to the tenth embodiment of the present invention, is shown in FIG. 19. According to the semiconductor LSI circuit of the tenth embodiment of the present invention, a first through a fourth transistor have gate electrodes 20, 22, 25, and 26 made of $n^+$ polysilicon, and fixed negative charges 52 are provided in a gate insulating layer 10u on one pMOSFET. More specifically, the tenth embodiment is different from the semiconductor LSI circuit according to the fourth embodiment, shown in FIG. 10, in that the third gate electrode 25 is made of $n^+$ polysilicon and fixed negative charges 52 are provided in the third gate insulating layer 10u. Since the threshold for one pMOSFET is decreased due to the fixed negative charges 52, the same characteristics as the current-voltage characteristics of the nMOSFET and the pMOSFET shown in FIG. 11 may be achieved. Since the pMOSFET is turned on only when $V_B=V_A$, the same results may be achieved as with the case of connecting pMOSFETs in series. On the other hand, since the nMOSFET is turned on in both cases, the same results may be achieved as with the case of connecting nMOSFETs in parallel. In other words, NOR gates may be provided.

A common drain region 14 or a shared metallic region may be made of titanium silicide ($TiSi_2$), cobalt silicide ($CoSi_2$), nickel silicide (NiSi), platinum silicide (PtSi) erbium silicide ($ErSi_2$) or the like.

According to the semiconductor LSI circuit of the tenth embodiment of the present invention, NOR gates are formed within a small area, and a highly integrated and microscopic structure can be provided.

ELEVENTH EMBODIMENT

Figure 20:
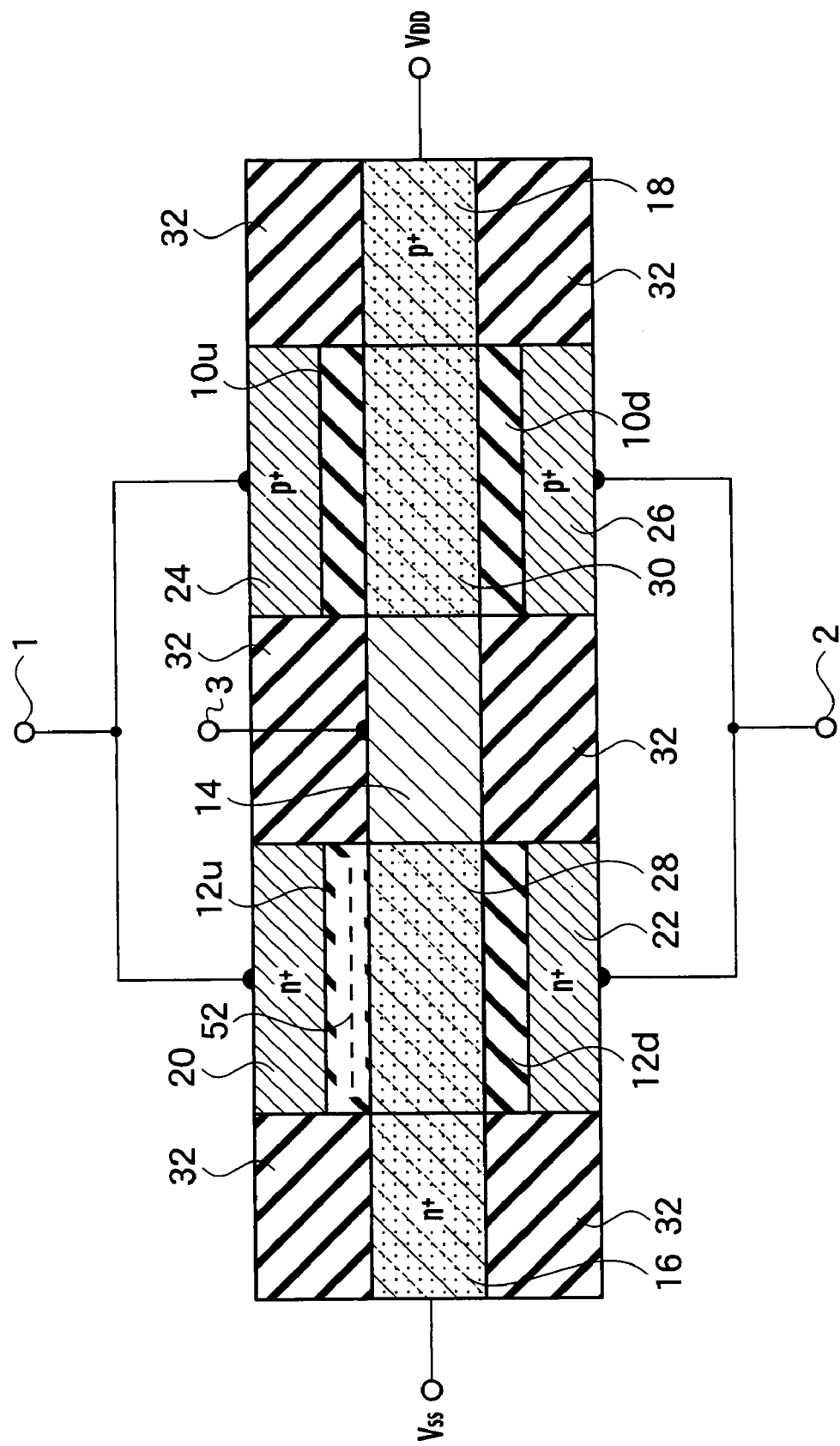
FIG. 20 shows a schematic cross-sectional structure of a semiconductor LSI circuit, according to an eleventh embodiment of the present invention.

A schematic cross-sectional structure of a semiconductor LSI circuit, according to the eleventh embodiment of the present invention, is shown in FIG. 20. According to the semiconductor LSI circuit of the eleventh embodiment of the present invention, a first and a second transistor include nMOSFET gate electrodes 20 and 22 made of $n^+$ polysilicon, a third and a fourth transistor include pMOSFET gate electrodes 24 and 26 made of $p^+$ polysilicon. Fixed negative charges 52 are provided in a gate insulating layer 12u on one nMOSFET. More specifically, the present invention is different from the semiconductor LSI circuit according to the third embodiment, shown in FIG. 8, in that the second gate electrode 22 is made of $n^+$ polysilicon and fixed negative charges 52 are provided in the first gate insulating layer 12u. Since the threshold for one nMOSFET is increased due to the fixed negative charges 52, the same characteristics as the current-voltage characteristics of the nMOSFETs and the pMOSFETs shown in FIG. 9 are achieved. Since the pMOSFET is turned on in both cases, the same results are achieved as with the case of connecting pMOSFETs in parallel. On the other hand, since the nMOSFET is turned on only when $V_B=V_A$, the same results may be achieved as with the case of connecting nMOSFETs in series. In other words, NAND gates are provided.

A common drain region 14 or a shared metallic region may be made of titanium silicide ($TiSi_2$), cobalt silicide ($CoSi_2$), nickel silicide (NiSi), platinum silicide (PtSi) erbium silicide ($ErSi_2$) or the like.

According to the semiconductor LSI circuit of the eleventh embodiment of the present invention, NAND gates are formed within a small area, and a highly integrated and microscopic structure can be provided.

TWELFTH EMBODIMENT

Figure 21:
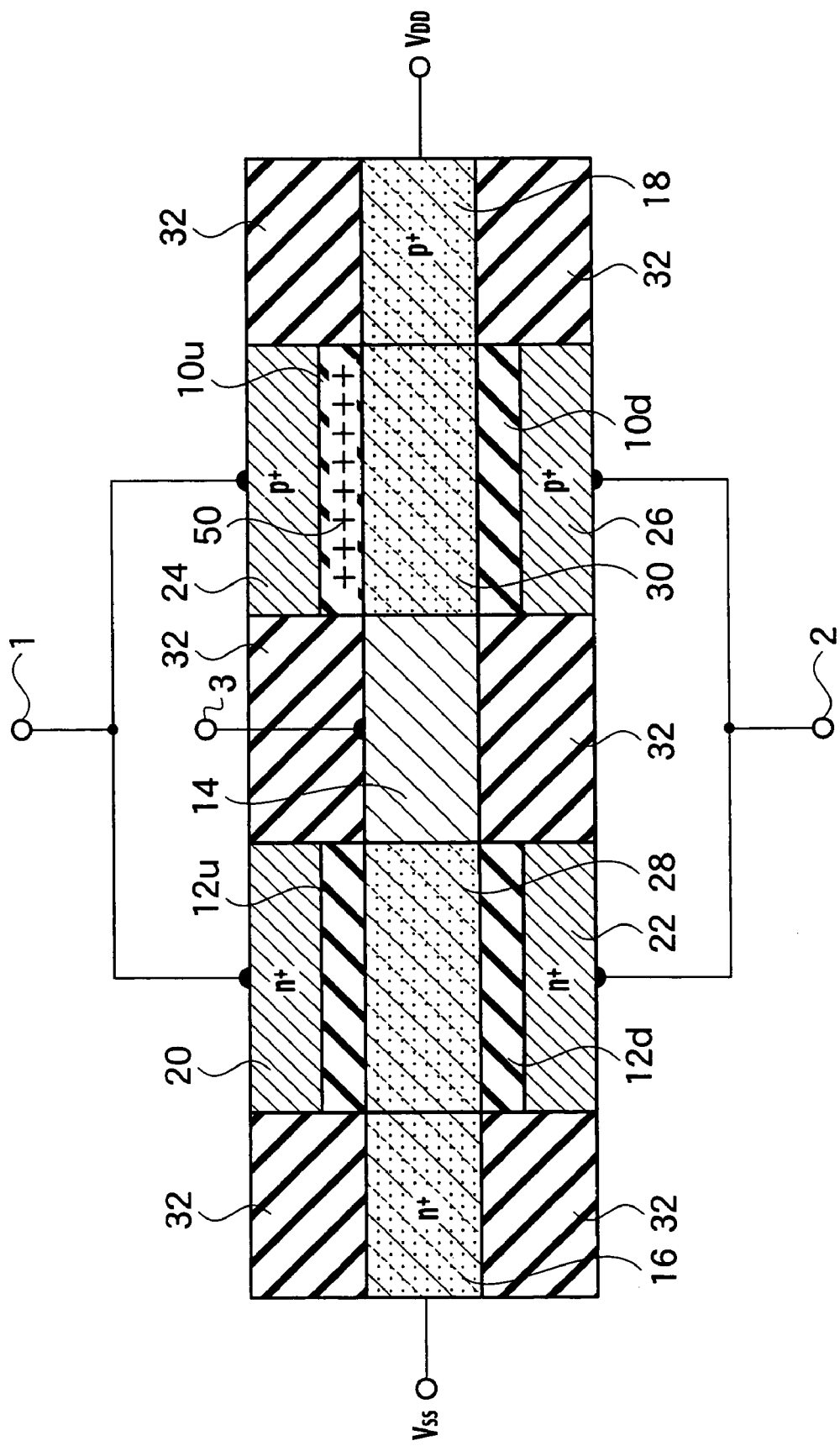
FIG. 21 shows a schematic cross-sectional structure of a semiconductor LSI circuit, according to a twelfth embodiment of the present invention.

A schematic cross-sectional structure of a semiconductor LSI circuit, according to the twelfth embodiment of the present invention is shown in FIG. 21. According to the semiconductor LSI circuit of the twelfth embodiment of the present invention, a first and a second transistor include nMOSFET gate electrodes 20 and 22 made of $n^+$ polysilicon, a third and a fourth transistor include pMOSFET gate electrodes 24 and 26 made of $p^+$ polysilicon. Fixed positive charges 50 are provided in a gate insulating layer 10u on one pMOSFET. More specifically, the present embodiment is different from the semiconductor LSI circuit according to the fourth embodiment, shown in FIG. 10, in that the fourth gate electrode 26 is made of $p^+$ polysilicon and fixed positive charges 50 are provided in the third gate insulating layer 10u. Since the threshold for one pMOSFET is increased due to the fixed positive charges 50, the same characteristics as the current-voltage characteristics of the nMOSFET and the pMOSFET shown in FIG. 11 are achieved. Since the pMOSFET is turned on only when $V_B=V_A$, the same results are achieved as with the case of connecting pMOSFETs in series. On the other hand, since the nMOSFET is turned on in both cases, the same results are achieved as with the case of connecting nMOSFETs in parallel. In other words, NOR gates may be provided.

A common drain region 14 or a shared metallic region may be made of titanium silicide ($TiSi_2$), cobalt silicide ($CoSi_2$), nickel silicide (NiSi), platinum silicide (PtSi) erbium silicide ($ErSi_2$) or the like.

Figure 22:
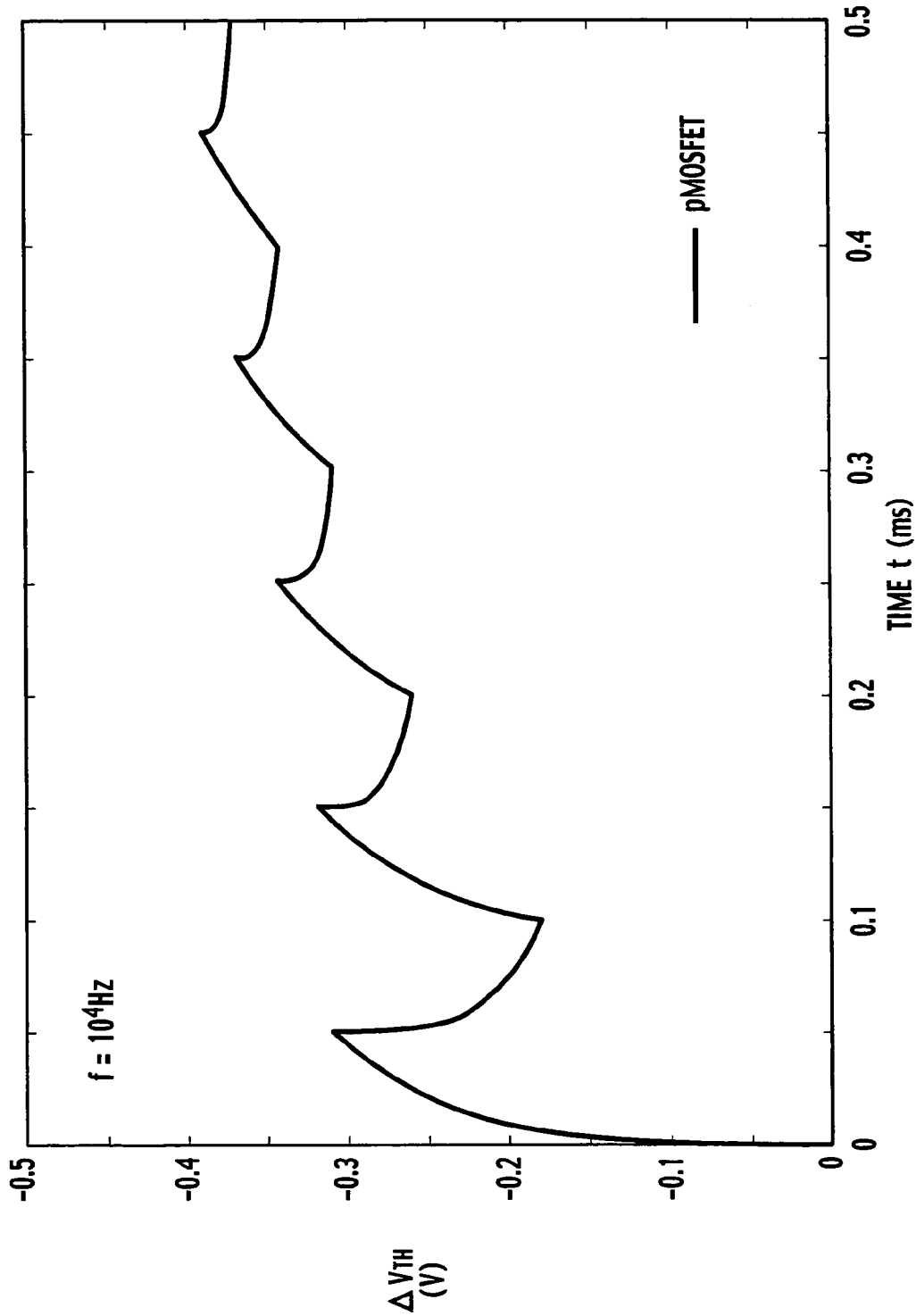
FIG. 22 is a graph showing variation in threshold for a MOSFET due to negative bias temperature instability (NBTI)

Fixed charges are provided in a gate insulating layer utilizing a trap level defect and the like. For example, fixed positive charges are provided by utilizing a phenomenon of negative bias temperature instability (NBTI). As shown in FIG. 22, a certain negative voltage is applied to pMOSFET gate electrodes for a certain length of time. This procedure applies a fixed positive charge in a gate insulating layer. Applying a negative bias to pMOSFET gate electrodes injects fixed positive charges into the gate insulating layers and traps the fixed positive charges in the trap level. The fixed positive charges provide an overall high pMOSFET thresholds. Fixed negative charges may be provided by forming a silicon nitride film (SiN) in the gate insulating layer so as to generate energy levels based on the composition of the insulating layer, thereby actively forming an electron trap level for trapping electrons.

According to the semiconductor LSI circuit of the twelfth embodiment of the present invention, NAND gates can be formed in a small area, and a highly integrated and microscopic structure can be provided.

THIRTEENTH EMBODIMENT

Figure 23:
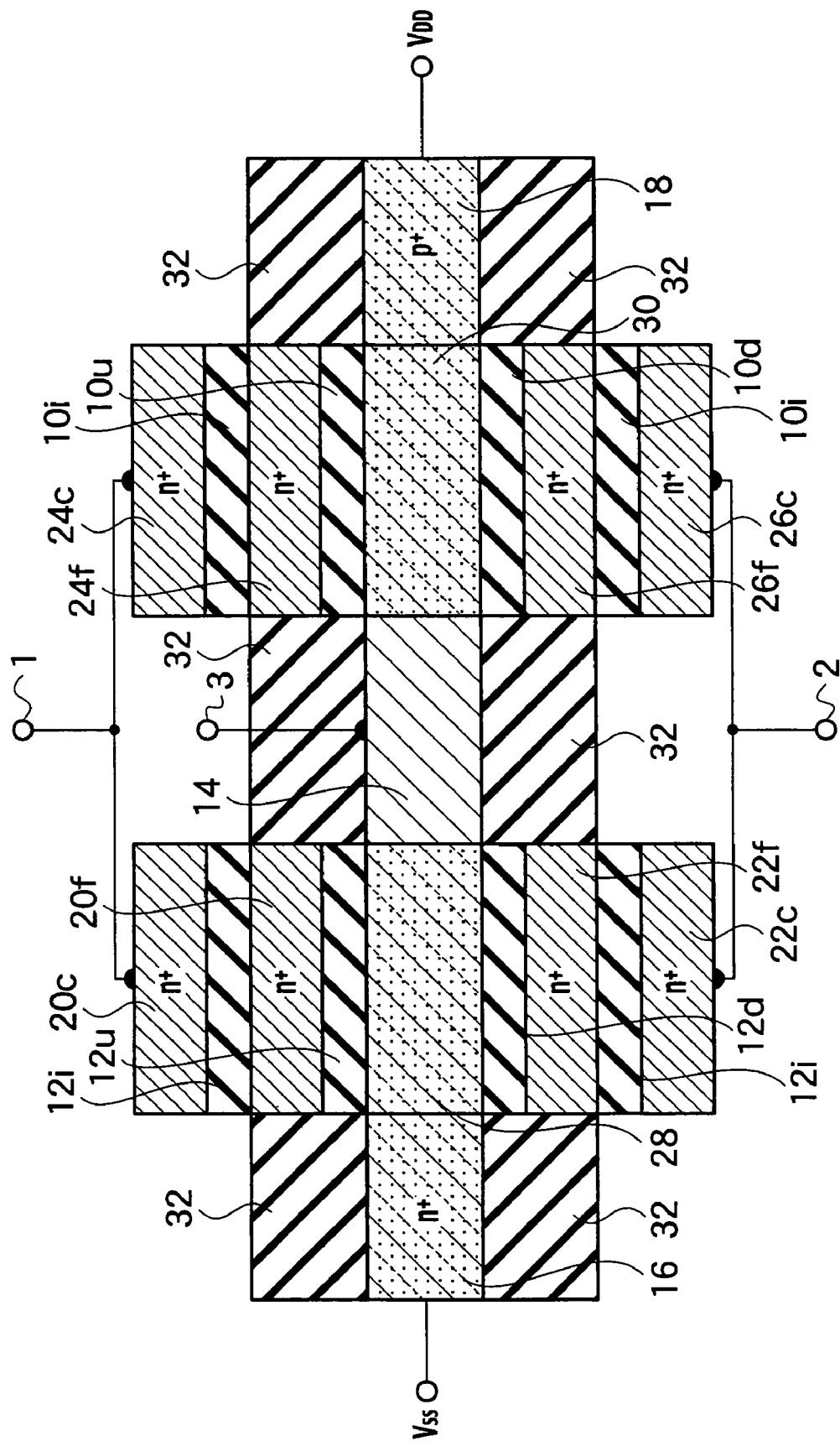
FIG. 23 shows a schematic cross-sectional structure of a semiconductor LSI circuit, according to a thirteenth embodiment of the present invention.

A schematic cross-sectional structure of a semiconductor LSI circuit, according to the thirteenth embodiment of the present invention, is shown in FIG. 23. As shown in FIG. 23, stacked structures made up of floating gate electrodes 20f, 22f, 24f, and 26f, and control gate electrodes 20c, 22c, 24c, and 26c are formed via inter-gate insulating layers 10i and 12i for all respective gates. A basic NAND or NOR gate with such stacked structure operates according to the sign and amount of charge accumulated in each of the floating gate electrodes 20f, 22f, 24f, and 26f. For example, electrons are injected into the floating gate electrode 20f or 22f of one nMOSFET. Thus, the floating gate electrodes 24f and 26 of respective pMOSFETs are brought into an excessively erased state. Consequently, a threshold for one nMOSFET is high and thresholds for respective pMOSFETs are low so as to achieve the same characteristics as the current-voltage characteristics of the nMOSFET and the pMOSFET shown in FIG. 9. Since the pMOSFET is turned on in both cases, the same results are achieved as with the case of connecting pMOSFETs in parallel. On the other hand, since the nMOSFET is turned on only when $V_B=V_A$, the same results are achieved as with the case of connecting nMOSFETs in series. In other words, NAND gates may be provided.

In addition, bringing the floating gate electrode 24f or 26f of one pMOSFET into an excessively erased state provides a low threshold for one pMOSFET, thereby achieving the same characteristics as the current-voltage characteristics of the nMOSFET and the pMOSFET shown in FIG. 11. Since the pMOSFET is turned on only when $V_B=V_A$, the same results may be achieved as with the case of connecting pMOSFETs in series. On the other hand, since the nMOSFET is turned on in both cases, the same results may be achieved as with the case of connecting nMOSFETs in parallel. In other words, NOR gates may be provided.

A common drain region 14 or a shared metallic region may be made of titanium silicide ($TiSi_2$), cobalt silicide ($CoSi_2$), nickel silicide (NiSi), platinum silicide (PtSi) erbium silicide ($ErSi_2$) or the like.

According to the semiconductor LSI circuit of the thirteenth embodiment of the present invention, NAND or NOR gates are formed within a small area, and a highly integrated and microscopic structure can be provided.

OTHER EMBODIMENT

The present invention has been described according to the aforementioned embodiments. However, it should not be perceived that descriptions and drawings that configure parts of this disclosure are intended to limit the spirit and scope of the present invention. Various alternative embodiments, working examples, and operational techniques will become apparent from this disclosure for those skilled in the art. Accordingly, the technical scope of the present invention is determined by only specified features according to the appended claims, that can be regarded appropriate from the above descriptions. Furthermore, the semiconductor devices according to the embodiments of the present invention may be combined operationally. In this manner, various modifications are possible within a range that does not deviate from the scope of the present invention.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A semiconductor LSI circuit, comprising:
   a first semiconductor region;
   a first gate insulating layer on one side of the first semiconductor region;
   a first gate electrode of a first conductivity type on the first gate insulating layer;
   a first source region and a common drain region sandwiching the first semiconductor region;
   a second gate insulating layer on the other side of the first semiconductor region;
   a second gate electrode of a second conductivity type opposite to the first conductivity type on the second gate insulating layer;
   a second semiconductor region adjacent to the common drain region;
   a third gate insulating layer on one side of the second semiconductor region;
   a third gate electrode on the third gate insulating layer;
   a second source region adjacent to the second semiconductor region and the common drain region;
   a fourth gate insulating layer on the other side of the second semiconductor region; and
   a fourth gate electrode on the fourth gate insulating layer;
   wherein the first semiconductor region, the first gate insulating layer, the first gate electrode, the first source region, and the common drain region constitute a first transistor; the first semiconductor region, the second gate insulating layer, the second gate electrode, the first source region, and the common drain region constitute a second transistor; the second semiconductor region, the third gate insulating layer, the third gate electrode, the second source region, and the common drain region constitute a third transistor; and the second semiconductor region, the fourth gate insulating layer, the fourth gate electrode, the second source region, and the common drain region constitute a fourth transistor, and
   wherein the electron affinity of the second pate electrode is smaller than that of the first pate electrode, and the first throuph the fourth transistors constitute a NAND pate.

2. The semiconductor LSI circuit according to claim 1, wherein two different potentials including a high potential and a low potential lower than the high potential are provided; wherein the high potential is applied to the second source region and the low potential is applied to the first source region.

3. The semiconductor LSI circuit of claim 1, wherein the common drain region is a common metallic region.

4. The semiconductor LSI circuit of claim 3, wherein the common metallic region forming the common drain region is any one of titanium silicide ($TiSi_2$), cobalt silicide ($CoSi_2$), nickel silicide (NiSi), platinum silicide (PtSi), and erbium silicide ($ErSi_2$).

5. The semiconductor LSI circuit of claim 1, wherein the electron affinity of the second source region is smaller than that of the second semiconductor region, and the electron affinity of the first source region is larger than that of the first semiconductor region.

6. The semiconductor LSI circuit of claim 5, wherein the first source region is an erbium silicide ($ErSi_2$) region to provide the first source region of the first transistor with a larger electron affinity than the first semiconductor region; and the second source region is a platinum silicide (PtSi)

region to provide the second source region of the third transistor with a smaller electron affinity than the second semiconductor region.

7. The semiconductor LSI circuit of claim 1, wherein the first and the second semiconductor regions are formed on an insulator that is formed on a semiconductor substrate; the first gate insulating layer, the first gate electrode, the second gate insulating layer, and the second gate electrode are stacked on the insulator; and the third gate insulating layer, the third gate electrode, the fourth gate insulating layer, and the fourth gate electrode are stacked on the insulator.

8. The semiconductor LSI circuit of claim 1, further comprising:
   a boat-shaped insulator buried in the semiconductor substrate,
   wherein the first source region, the first gate electrode, the common drain region, the third gate electrode, the second source region, the fourth gate electrode, and the second gate electrode are formed and enclosed by the insulator.

9. The semiconductor LSI circuit of claim 1, wherein the common drain region is a common semiconductor region, and a metal silicide region is formed only on the surface of the common drain region.

10. The semiconductor LSI circuit of claim 9, wherein the metal silicide region formed only on the surface of the common drain region is any one of titanium suicide ($TiSi_2$), cobalt suicide ($CoSi_2$), nickel suicide (NiSi), platinum suicide (PtSi), and erbium suicide ($ErSi_2$).

11. The semiconductor LSI circuit according to claim 1, wherein the third gate and fourth gate electrodes are gate electrodes of the second conductivity type.

12. The semiconductor LSI circuit according to claim 11, wherein the first gate electrode is an n+ polysilicon gate electrode, and the second through the fourth gate electrodes are p+ polysilicon gate electrodes.

* * * * *